United States Patent
Itoh et al.

(10) Patent No.: US 8,421,837 B2
(45) Date of Patent: Apr. 16, 2013

(54) SURFACE-EMITTING LASER ELEMENT, SURFACE-EMITTING LASER ARRAY, OPTICAL SCANNING DEVICE, AND IMAGE FORMING APPARATUS

(75) Inventors: Akihiro Itoh, Miyagi (JP); Shunichi Sato, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 362 days.

(21) Appl. No.: 12/478,085

(22) Filed: Jun. 4, 2009

(65) Prior Publication Data

US 2009/0303308 A1 Dec. 10, 2009

(30) Foreign Application Priority Data

Jun. 5, 2008 (JP) ................. 2008-148008

(51) Int. Cl.
*B41J 2/45* (2006.01)
*H01S 5/00* (2006.01)

(52) U.S. Cl.
USPC .................... 347/238; 372/45.01; 372/46.013

(58) Field of Classification Search .................. 347/232, 347/238; 372/24, 45.01, 45.011, 50.11, 50.124, 372/44.011, 46.013, 46.01
See application file for complete search history.

(56) References Cited

U.S. PATENT DOCUMENTS

| | | | |
|---|---|---|---|
| 5,331,654 A | 7/1994 | Jewell et al. | |
| 5,727,014 A | 3/1998 | Wang et al. | |
| 5,923,691 A | 7/1999 | Sato | |
| 5,939,733 A | 8/1999 | Sato | |
| 6,002,700 A | 12/1999 | Sato | |
| 6,072,196 A | 6/2000 | Sato | |
| 6,207,973 B1 | 3/2001 | Sato et al. | |
| 6,233,264 B1 | 5/2001 | Sato | |
| 6,542,528 B1 | 4/2003 | Sato et al. | |
| 6,563,851 B1 | 5/2003 | Jikutani et al. | |
| 6,614,821 B1 | 9/2003 | Jikutani et al. | |
| 6,674,785 B2 | 1/2004 | Sato et al. | |

(Continued)

FOREIGN PATENT DOCUMENTS

| | | |
|---|---|---|
| EP | 1496583 A1 | 1/2005 |
| EP | 1780849 A1 * | 5/2007 |

(Continued)

OTHER PUBLICATIONS

U.S. Appl. No. 11/993,406, filed Dec. 20, 2007 of Shunichi Sato et al. (not yet published).

(Continued)

*Primary Examiner* — Hai C Pham
(74) *Attorney, Agent, or Firm* — Cooper & Dunham LLP

(57) ABSTRACT

A surface-emitting laser element for emitting light in a direction perpendicular to a substrate, including a substrate with a normal direction of a principal plane inclining toward one direction of <1 1 1> with respect to one direction of <1 0 0> and a mesa structure formed on the substrate and having a narrowed structure with an oxide produced by oxidizing a part of a layer to be oxidized selectively, containing aluminum and surrounding an electric current passage area, wherein a cross-section of mesa structure being parallel to the substrate is parallel to a substrate surface and orthogonal to both one direction of <1 0 0> and one direction of <1 1 1> and a length in a first direction passing through a center of the electric current passage area is more than a length in a second direction parallel to a substrate surface and orthogonal to the first direction.

9 Claims, 37 Drawing Sheets

U.S. PATENT DOCUMENTS

| | | | |
|---|---|---|---|
| 6,700,914 B2 * | 3/2004 | Yokouchi et al. | 372/50.11 |
| 6,765,232 B2 | 7/2004 | Takahashi et al. | |
| 6,803,604 B2 | 10/2004 | Takahashi et al. | |
| 6,927,412 B2 | 8/2005 | Takahashi et al. | |
| 6,959,025 B2 | 10/2005 | Jikutani et al. | |
| 6,975,663 B2 | 12/2005 | Sekiya et al. | |
| 2005/0158902 A1 | 7/2005 | Chua et al. | |
| 2005/0185688 A1 | 8/2005 | Nakayama et al. | |
| 2007/0091959 A1 | 4/2007 | Royo | |
| 2007/0280322 A1 | 12/2007 | Sato et al. | |
| 2008/0024849 A1 | 1/2008 | Hayashi et al. | |
| 2008/0055672 A1 | 3/2008 | Watanabe et al. | |
| 2008/0056321 A1 | 3/2008 | Motomura et al. | |
| 2008/0212636 A1 | 9/2008 | Sato et al. | |
| 2008/0233017 A1 | 9/2008 | Sato et al. | |
| 2009/0022199 A1 | 1/2009 | Jikutani et al. | |
| 2009/0262770 A1 | 10/2009 | Itoh et al. | |
| 2009/0285602 A1 * | 11/2009 | Harasaka et al. | 399/221 |

FOREIGN PATENT DOCUMENTS

| | | |
|---|---|---|
| JP | 9-172218 | 6/1997 |
| JP | 11-307882 | 11/1999 |
| JP | 3677883 | 5/2005 |
| JP | 3713725 | 9/2005 |
| JP | 3762765 | 1/2006 |
| JP | 3799667 | 5/2006 |
| JP | 2007-142375 | 6/2007 |
| WO | WO2008/026460 A1 | 3/2008 |

OTHER PUBLICATIONS

U.S. Appl. No. 12/090,467, filed Apr. 16, 2008 of Shunichi Sato et al. (not yet published).

U.S. Appl. No. 12/090,934, filed Apr. 21, 2008 of Akihiro Itoh et al. (not yet published).

Iga, Kenichi et al., "Basis and Application of a Surface-Emitting Laser", Kyoritsu Shuppan Co., Ltd.

Mizutani, Akimasa et al., "A Low-Threshold Polarization-Controlled Vertical-Cavity Surface-Emitting Laser Grown on GaAs (311)B Substrate", IEEE Photonics Technology Letters, vol. 10, No. 5, pp. 633-635, May 1998.

Jan. 11, 2011 European search report in connection with counterpart European patent application No. 09 25 1494.

* cited by examiner

FIG.8A
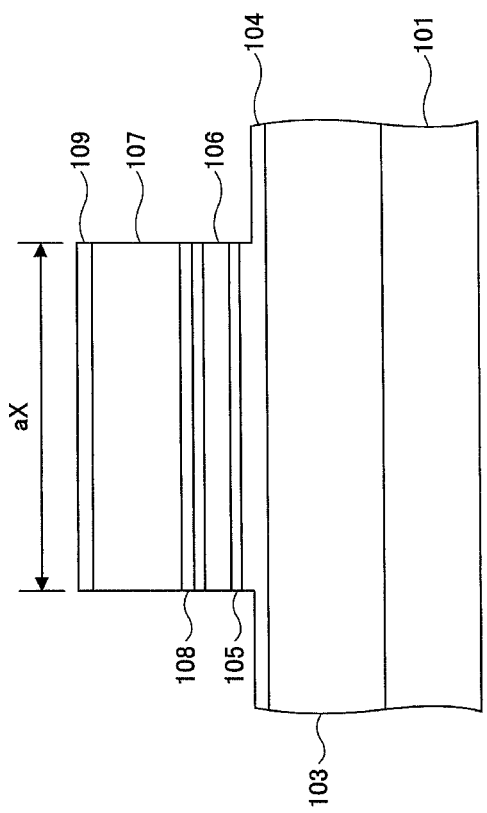
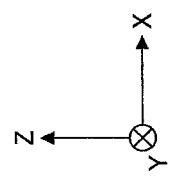

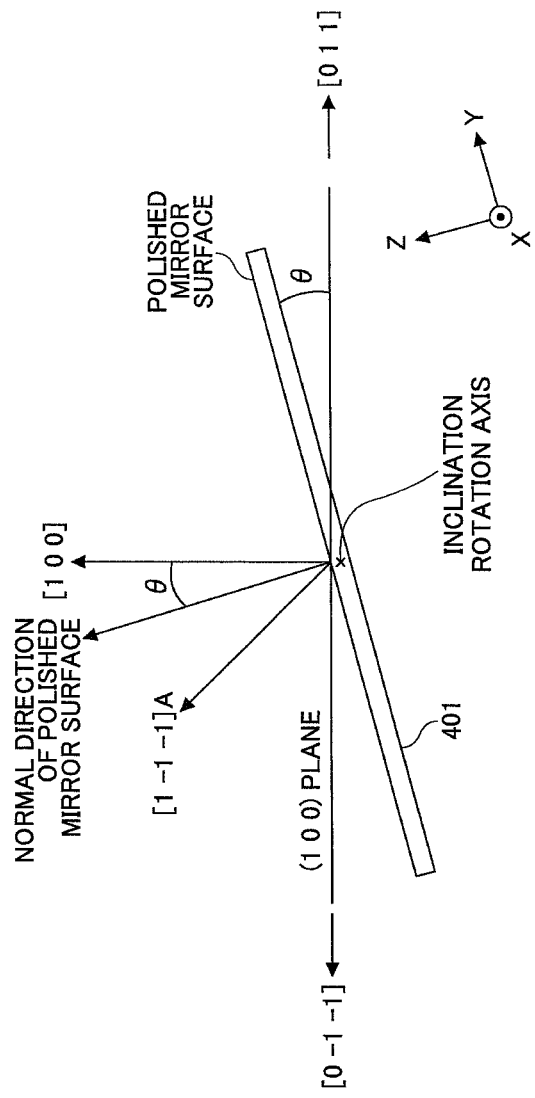

FIG.22

| LARGEST WIDTH / SMALLEST WIDTH | DIVERGENCE ANGLE $\theta x$ (DEGREE(S)) WITH RESPECT TO X-AXIS DIRECTION | DIVERGENCE ANGLE $\theta y$ (DEGREE(S)) WITH RESPECT TO Y-AXIS DIRECTION | $\theta x / \theta y$ | SHAPE OF CROSS-SECTION OF LIGHT BEAM |
|---|---|---|---|---|
| 1.03 | 7.0 | 7.0 | 1.0 | CIRCULAR SHAPE |
| 1.33 | 7.0 | 5.0 | 1.4 | ELLIPTICAL SHAPE |
| 1.09 | 6.5 | 6.1 | 1.1 | CIRCULAR SHAPE |
| 1.22 | 6.4 | 4.8 | 1.3 | ELLIPTICAL SHAPE |
| 1.00 | 7.0 | 7.0 | 1.0 | CIRCULAR SHAPE |
| 1.28 | 7.0 | 5.5 | 1.3 | ELLIPTICAL SHAPE |
| 1.04 | 7.0 | 7.0 | 1.0 | CIRCULAR SHAPE |
| 1.25 | 7.0 | 4.9 | 1.4 | ELLIPTICAL SHAPE |
| 1.15 | 6.0 | 5.4 | 1.1 | CIRCULAR SHAPE |
| 1.22 | 6.0 | 5.0 | 1.2 | ELLIPTICAL SHAPE |

SURFACE-EMITTING LASER ELEMENT, SURFACE-EMITTING LASER ARRAY, OPTICAL SCANNING DEVICE, AND IMAGE FORMING APPARATUS

BACKGROUND OF THE INVENTION

1. Field of the Invention

The present invention relates to a surface-emitting laser element, a surface-emitting laser array, an optical scanning device, and an image forming apparatus.

2. Description of the Related Art

A vertical-cavity-type surface emitting laser (also referred to as "VCSEL" below) element is to emit light to a direction perpendicular to its substrate, has a lower price and lower electric power consumption, and is more compact, than an edge-emitting-type semiconductor laser element for emitting light to a direction parallel to its substrate, is suitable to a two-dimensional device, and has a high performance, and therefore has attracted attention recently.

For an application field of VCSEL, there are provided a light source (oscillation wavelength: 780 nm band) for a light-writing system in a printer, a light source (oscillation wavelength: 780 nm band and 850 nm band) for light-writing in an optical disk device, a light source for optical transmission system (oscillation wavelength: 1.3 μm band and 1.5 μm band) such as a LAN (Local Area Network) using an optical fiber, and the like. Furthermore, it has also been expected as a light source for optical transmission between boards, in a board, between chips of large scale integrated circuit (LSI), and in a chip of LSI.

In these application fields of VCSEL, it may frequently be required that light emitted from VCSEL (also referred to as "output light" below) has (1) a single wavelength, (2) a constant polarization mode, (3) a circular shaped cross-section of output light.

For example, a mirror or lens is used for focusing output light in a light-writing system and it may be necessary to conduct a precise and complex control of an optical path. In this case, because a mirror has a property of reflectivity that varies depending on the polarization direction of incident light and a lens has a property of a refractive angle that varies depending on a wavelength, it is preferable for output light to has a single wavelength and a constant polarization mode in order to suppress variation of a light intensity and blurring of a dot on a writing surface. Furthermore, it is desirable that the cross-sectional shape of a light beam irradiating a writing surface is circular in order to obtain a high definition quality of writing.

It is possible to evaluate the cross-sectional shape of a light beam by an FFP (Far Field Pattern), wherein the FFP strongly depends on the shape of an electric current passage area in an oxidized and narrowed structure. For example, in the case of a basic mode operation, the larger the width of an electric current passage area is, the narrower a FFP is, and the smaller the width of an electric current passage area is, the broader a FFP is. Therefore, it may be necessary for an electric current passage area to have a highly symmetric shape such as a square and a circle in order to a circular FFP.

Meanwhile, the oxidation rate in selectively oxidizing a layer to be oxidized selectively varies depending on its crystallographic orientation. For example, the oxidation rate of a layer to be oxidized selectively which is laminated on a substrate whose principal plane is a (1 0 0) plane (non-inclination substrate) has a 4-fold symmetry.

Therefore, it has been suggested that the outline of a mesa is adjusted in VCSEL manufacturing using a non-inclination substrate, in order to obtain an electric current passage area having a good symmetry such as a circle (For example, see Japanese Patent Application Publication No. 2007-142375 and Japanese Patent No. 3762765).

Furthermore, a special device may be required and various methods have been attempted in order to control a polarization mode, because the basic structure of VCSEL has a high symmetry (For example, see Japanese Patent Application Publication No. 09-172218, Japanese Patent No. 3799667, and Japanese Patent Application Publication No. 11-307882).

Moreover, it has been suggested that a so-called inclination substrate is used in order to a polarization mode (see IGA and KOYAMA, "Basic and Application of a Surface-Emitting Laser", KYORITSU SHUPPAN CO., LTD, and A. Mizutam, N. Hatori, N. Nishiyama, F. Koyama and K. Iga, "A Low-Threshold Polarization-Controlled Vertical-Cavity Surface-Emitting Laser Grown on GaAs (311)B Substrate", IEEE Photonics Technology Letters, Vol. 10, No. 5, 1998 MAY, p.p. 633-63).

However, the 4-fold symmetry of the oxidation rate in selectively oxidizing a layer to be oxidized selectively may be broken in VCSEL manufacturing using an inclination substrate. Therefore, the shape of an electric current passage area may be a polygon having a low symmetry such as a rectangle and an irregular ellipse, even for a mesa (mesa structure) whose cross-sectional shape parallel to a substrate has a high symmetry such as square, a regular polygon, and a circle. Thus, when the shape of an electric current passage area is a rectangle or an ellipse, the FFP of output light of a light source for writing may be elliptic and the shape of a light spot on a photoconductor surface may also be elliptic Therefore, there may be a disadvantage such that the fineness of writing may be degraded.

SUMMARY OF THE INVENTION

According to one aspect of the present invention, there is provided a surface-emitting laser element configured to emit light in a direction perpendicular to a substrate, including a substrate with a normal direction of a principal plane inclining toward one direction of a crystallographic orientation of <1 1 1> with respect to one direction of a crystallographic orientation of <1 0 0> and a mesa structure being formed on the substrate and having a narrowed structure with an oxide including at least an oxide produced by oxidizing a part of a layer to be oxidized selectively, the oxide containing aluminum and surrounding an electric current passage area, wherein a cross-section of the mesa structure being parallel to the substrate is parallel to a surface of the substrate and orthogonal to both the one direction of a crystallographic orientation of <1 0 0> and the one direction of a crystallographic orientation of <1 1 1> and a length in a first direction passing through a center of the electric current passage area is more than a length in a second direction parallel to a surface of the substrate and orthogonal to the first direction.

According to another aspect of the present invention, there is provided a surface-emitting laser array, wherein the surface-emitting laser elements as described above are integrated.

According to another aspect of the present invention, there is provided an optical scanning device configured to scan a surface to be scanned with a light beam, including a light source having the surface-emitting laser element as described above, a deflector configured to deflect a light beam from the light source, and a scanning optical system configured to focus a light beam deflected by the deflector on a surface to be scanned.

According to another aspect of the present invention, there is provided an optical scanning device configured to scan a surface to be scanned with a light beam, including a light source having the surface-emitting laser array as described above, a deflector configured to deflect a light beam from the light source, and a scanning optical system configured to focus a light beam deflected by the deflector on a surface to be scanned.

According to another aspect of the present invention, there is provided an image forming apparatus including at least one image carrier and at least one optical scanning device as described above being configured to scan the at least one image carrier with a light beam containing image information.

According to another aspect of the present invention, there is provided an image forming apparatus configured to form an image on an object using a light beam, wherein the light beam is a light beam emitted from the surface-emitting laser element as described above.

According to another aspect of the present invention, there is provided an image forming apparatus configured to form an image on an object using plural light beams, wherein the plural light beams are plural light beams emitted from the surface-emitting laser array as described above.

BRIEF DESCRIPTION OF THE DRAWINGS

FIG. 8A and FIG. 8B are diagrams for illustrating the outline of a mesa, respectively.

FIG. 16A and FIG. 16B are diagrams for illustrating a substrate in FIG. 15, respectively.

FIG. 22 is a diagram for illustrating the relations among the ratio of the largest width/smallest width in the shape of an electric current passage area, a divergence angle, and the cross-sectional shape of a light beam.

DETAILED DESCRIPTION OF THE PREFERRED EMBODIMENTS

Figure 1:
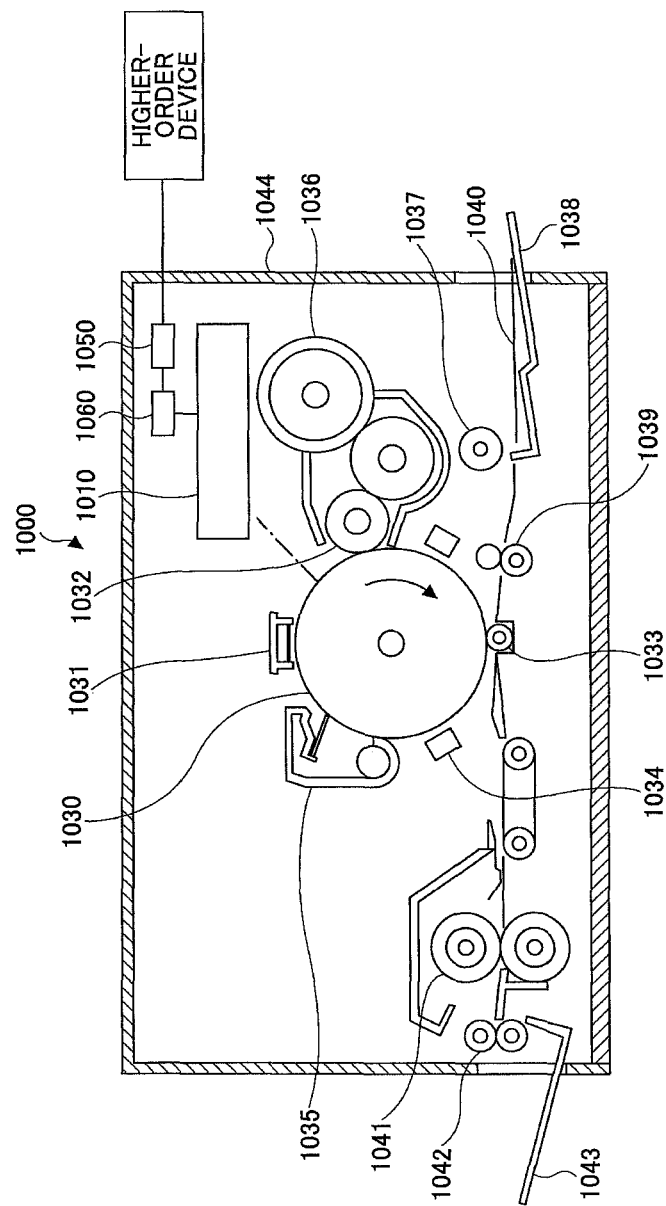
FIG. 1 is a diagram for illustrating a general structure of a laser printer according to one embodiment of the present invention.

Next, some illustrative embodiments of the present invention will be described below.

An embodiments of the present invention relates to at least one of a surface-emitting laser element, a surface-emitting laser array, an optical scanning device, and an image forming apparatus, and more particularly, relates to at least one of a surface-emitting laser element for emitting light to a direction perpendicular to a substrate, a surface-emitting laser array for which the surface-emitting laser elements are integrated, an optical scanning device and image forming apparatus using light from the surface-emitting laser element or surface-emitting laser array.

A first object of an embodiment of the present invention is to provide a surface-emitting laser element and surface-emitting laser array wherein the stability of a light polarization direction is high and the cross-sectional shape of an output light beam is nearly circular while no cost increase is caused.

Furthermore, a second object of an embodiment of the present invention is to provide an optical scanning device wherein no cost increase is caused and it is possible to conduct optical scanning with a high precision.

Moreover, a third object of an embodiment of the present invention is to provide an image forming apparatus wherein no cost increase is caused and it is possible to form a high-quality image.

From a first viewpoint, an embodiment of the present invention is a surface-emitting laser element for emitting light in a direction perpendicular to a substrate, wherein the surface-emitting laser element includes a substrate with a normal direction of a principal plane that inclines toward one direction of a crystallographic orientation of <1 1 1> with respect to one direction of a crystallographic orientation of <1 0 0>, and a mesa structure that is formed on the substrate and has a narrowed structure in which an oxide including at least an oxide produced by oxidizing a part of a layer to be oxidized selectively which contains aluminum surrounds an electric current passage area, wherein a cross-section of the mesa structure which is parallel to the substrate is parallel to a surface of the substrate and orthogonal to both the one direction of a crystallographic orientation of <1 0 0> and the one direction of a crystallographic orientation of <1 1 1> and a length in a first direction passing through a center of the electric current passage area is more than a length in a second direction parallel to a surface of the substrate and orthogonal to the first direction.

Thereby, it may be possible to increase the stability of a light polarization direction and to make the cross-sectional shape of an output light beam to be nearly circular, while no cost increase is caused.

From a second viewpoint, an embodiment of the present invention is a surface-emitting laser array in which the surface-emitting laser elements according to the above-embodiment of the present invention are integrated.

Thereby, it may be possible to increase the stability of a light polarization direction and to make the cross-sectional shape of an output light beam to be nearly circular, while no cost increase is caused, because the surface-emitting laser elements according to the above-embodiment of the present invention are integrated.

From a third viewpoint, an embodiment of the present invention is a first optical scanning device for scanning a surface to be scanned with light, wherein the optical scanning device includes a light source having a surface-emitting laser element according to the above-mentioned embodiment of the present invention, a deflector for deflecting light from the light source, and a scanning optical system for focusing light deflected by the deflector on a surface to be scanned.

From a fourth viewpoint, an embodiment of the present invention is a second optical scanning device for scanning a surface to be scanned with light, wherein the optical scanning device includes a light source having the surface-emitting laser array according to the above-mentioned embodiment of the present invention, a deflector for deflecting light from the light source, and a scanning optical system for focusing light deflected by the deflector on a surface to be scanned.

According to the first or second optical scanning device, it may be possible to conduct optical scanning with a high precision while no cost increase is caused, because a light source has a surface-emitting laser element or surface-emitting laser array of the above-mentioned embodiment of the present invention.

From a fifth viewpoint, an embodiment of the present invention is a first image forming apparatus including at least one image carrier, and at least one optical scanning device according to the above-embodiment of the present invention for scanning the at least one image carrier with light containing image information.

From a sixth viewpoint, an embodiment of the present invention is a second image forming apparatus for forming an image on an object using light, wherein the light is light emitted from the surface-emitting laser element according to the above-embodiment of the present invention.

From a seventh viewpoint, an embodiment of the present invention is a third image forming apparatus for forming an image on an object using plural lights, wherein the plural lights are plural lights emitted from the surface-emitting laser array according to the above-mentioned embodiment of the present invention.

According to any of the first to third image forming apparatus, it may be possible to form a high-quality image without causing cost increase, because light emitted from a surface-emitting laser element or surface-emitting laser array according to the above-mentioned embodiment of the present invention is used.

One embodiment of the present invention will be described below while referring to FIG. 1 to FIG. 9. FIG. 1 illustrated a general structure of a laser printer 1000 according to one embodiment of the present invention.

The laser printer 1000 includes an optical scanning device 1010, a photoconductor drum 1030, a charging charger 1031, a development roller 1032, a transfer charger 1033, a charge removal unit 1034, a cleaning unit 1035, a toner cartridge 1036, a paper feed control roller 1037, a paper feed tray 1038, a resist roller pair 1039, a fixation roller 1041, a paper ejection roller 1042, a paper ejection tray 1043, a communication control device 1050, a printer control device 1060 for integrally controlling each part as mentioned above, and the like. Additionally, these are contained at their predetermined positions in a printer housing 1044.

The communication control device 1050 controls two-way communication with a higher-order device (for example, a personal computer) through a network or the like.

The photoconductor drum 1030 is a cylindrical member wherein a photoconductor layer is formed on its surface. That is, the surface of the photoconductor drum 1030 is a surface to be scanned. Then, the photoconductor drum 1030 is configured to rotate to the direction of an arrow in FIG. 1.

Each of the charging charger 1031, development roller 1032, transfer charger 1033, charge removal unit 1034, and cleaning unit 1035 is arranged near the surface of the photoconductor drum 1030. Then, the charging charger 1031, the development roller 1032, the transfer charger 1033, the charge removal unit 1034, and the cleaning unit 1035 are arranged in order along the rotation direction of the photoconductor drum 1030.

The charging charger 1031 charges the surface of the photoconductor drum 1030 uniformly.

The optical scanning device 1010 irradiates the surface of photoconductor drum 1030 which is charged by the charging charger 1031, with a light beam modulated based on image information from a higher-order device. Thereby, a latent image corresponding to image information is formed on the surface of the photoconductor drum 1030. The latent image formed herein moves toward the development roller 1032 according to rotation of the photoconductor drum 1030. Additionally, the configuration of the optical scanning device 1010 will be described later.

Toner is stored in the toner cartridge 1036 and the toner is fed onto the development roller 1032.

The development roller 1032 makes the toner fed from the toner cartridge 1036 adhere to the latent image formed on the surface of the photoconductor drum 1030 so as to visualize the image in accordance with image information. Herein, the latent image on which the toner adheres (also referred to as, conveniently, a "toner image" below) moves toward the transfer charger 1033 according to rotation of the photoconductor drum 1030.

A recording paper sheets 1040 is stored in the paper feed tray 1038. The paper feed control roller 1037 is arranged near the paper feed tray 1038, and the paper feed control roller 1037 picks up the recording paper sheet 1040 from the paper feed tray 1038 one by one and delivers it to the resist roller pair 1039. The resist roller pair 1039 temporarily holds the recording paper sheet 1040 picked up by the paper feed control roller 1037 and the recording paper sheet 1040 is sent to the gap between the photoconductor drum 1030 and the transfer charger 1033 in accordance with rotation of the photoconductor drum 1030.

For electrically attracting the toner on the surface of the photoconductor drum 1033 to the recording paper sheet 1040, an electric voltage with a polarity opposite to that of the toner is applied on the transfer charger 1033. Due to this voltage, a toner image on the surface of the photoconductor drum 1030 is transferred to the recording paper sheet 1040. The recording paper sheet 1040 subjected to the transfer herein is sent to the fixation roller 1041.

Heat and a pressure are applied on the recording paper sheet 1040 by the fixation roller 1041, whereby the toner is fixed on the recording paper sheet 1040. The recording paper sheet subjected to the fixation herein is sent to the paper ejection tray 1043 via the paper ejection roller 1042 and stacked on the paper ejection tray 1043 sequentially.

The charge removal unit 1034 removes a charge on the surface of the photoconductor drum 1030.

The cleaning unit 1035 removes the toner (residual toner) remaining on the surface of the photoconductor drum 1030. The surface of photoconductor drum 1030, from which the residual toner has been removed, returns to a position opposing to the charging charger 1031 again.

Next, the structure of the optical scanning device 1010 will be described.

Figure 2:
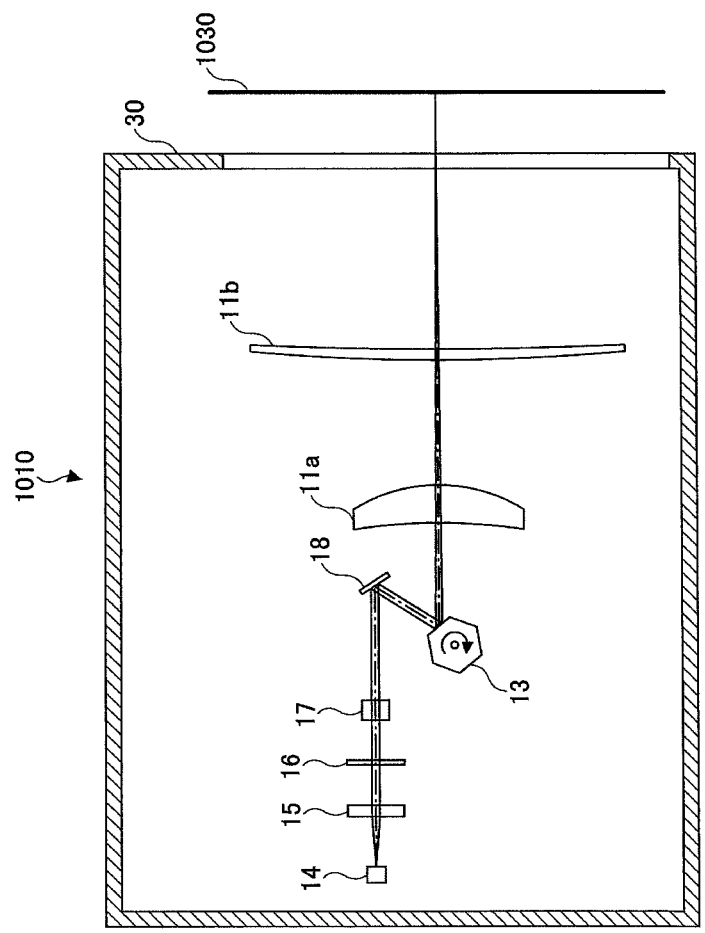
FIG. 2 is a schematic diagram illustrating an optical scanning device in FIG. 1.

As illustrated in FIG. 2 by way of example, the optical scanning device 1010 includes a deflector-side scanning lens 11*a*, an image-side scanning lens 11*b*, a polygon mirror 13, a light source 14, a coupling lens 15, an aperture plate 16, an anamorphic lens 17, a reflection mirror 18, a scanning control device (whose illustration is omitted in the figure), and the like. Then, these are installed at their predetermined positions in a housing 30.

In Addition, conveniently, a direction corresponding to a main scanning direction will be abbreviated as a "main scanning corresponding direction" and a direction corresponding to a sub-scanning direction will be abbreviated as a "sub-scanning corresponding direction", below.

The coupling lens 15 makes a light beam emitted from the light source 14 be a nearly-collimated light. The light source 14 and the coupling lens 15 are fixed on one holding member made of aluminum and integrated as a unit.

The aperture plate 16 has an opening and defines the beam size of a light beam passing through the coupling lens 15.

The anamorphic lens 17 images a light beam passing through the opening of the aperture plate 16 at near a deflection and reflection surface of the polygon mirror 13 with respect to the sub-scanning corresponding direction, via the reflection mirror 18.

An optical system arranged in the optical path between the light source 14 and the polygon mirror 13 is also referred to as a pre-deflector optical system. In the present embodiment, the pre-deflector optical system is composed of the coupling lens 15, the aperture plate 16, the anamorphic lens 17, and the reflection mirror 18.

The polygon mirror 13 has a hexahedral mirror with an inscribed circle diameter of 18 mm by way of example, and each mirror is a deflection and reflection surface. The polygon mirror 13 deflects a light beam from the reflection mirror 18 while rotating at a constant speed around an axis parallel to the sub-scanning corresponding direction.

The deflector-side scanning lens 11*a* is arranged in the light path of a light beam deflected by the polygon mirror 13.

The image-side scanning lens 11*b* is arranged in the light path of a light beam passing through the deflector-side scanning lens 11*a*. Then, the light beam passing through the image-side scanning lens 11*b* irradiates the surface of the photoconductor drum 1030 so as to form a light spot. The light spot moves in a longitudinal direction of the photoconductor drum 1030 according to rotation of the polygon mirror. That is, scanning is conducted on the photoconductor drum 1030. Then, the direction of movement of the light spot is a "main scanning direction". Also, the direction of rotation of the photoconductor drum 1030 is a "sub-scanning direction".

An optical system arranged in the optical path between the polygon mirror 13 and the photoconductor drum 1030 is also referred to as a scanning optical system. In the present embodiment, the scanning optical system is composed of the deflector-side scanning lens 11*a* and the image-side scanning lens 11*b*. Additionally, at least one folding mirror may be arranged in at lease one of the optical path between the deflector-side scanning lens 11*a* and the image-side scanning lens 11*b* and the optical path between the image-side scanning lens 11*b* and the photoconductor drum 1030.

Figure 3:
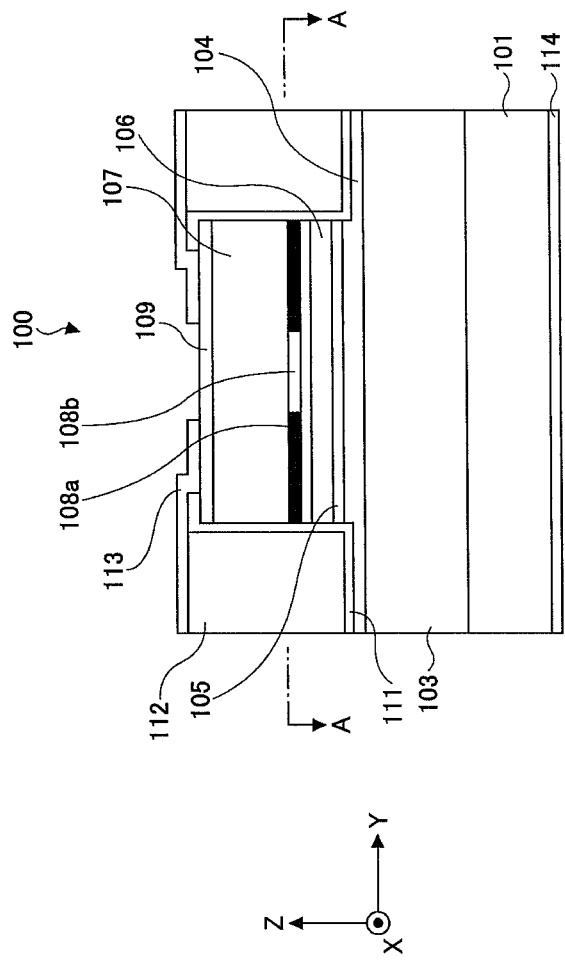
FIG. 3 is a diagram for illustrating a surface-emitting laser element included in a light source in FIG. 2.

As illustrated in FIG. 3 by way of example, the light source 14 has a surface-emitting laser element 100. Additionally, in the present specification, illustration will be provided while the direction of laser oscillation is a Z-axis direction and the two directions orthogonal to each other in a plane perpendicular to the Z-axis direction are X-axis direction and Y-axis direction.

The surface-emitting laser element 100 is a surface-emitting laser whose design oscillation wavelength is a 780 nm band, and includes a substrate 101, a lower semiconductor DBR 103, a lower spacer layer 104, an active layer 105, an upper spacer layer 106, an upper semiconductor DBR 107, a contact layer 109, and the like.

Figure 4A:
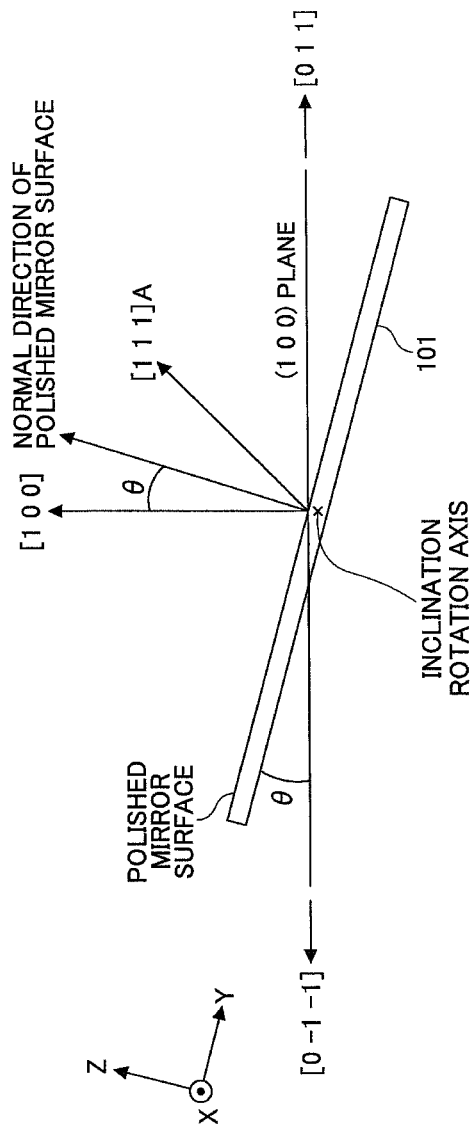
FIG. 4A and FIG. 4B are diagrams for illustrating a substrate in FIG. 3, respectively.
Figure 4B:
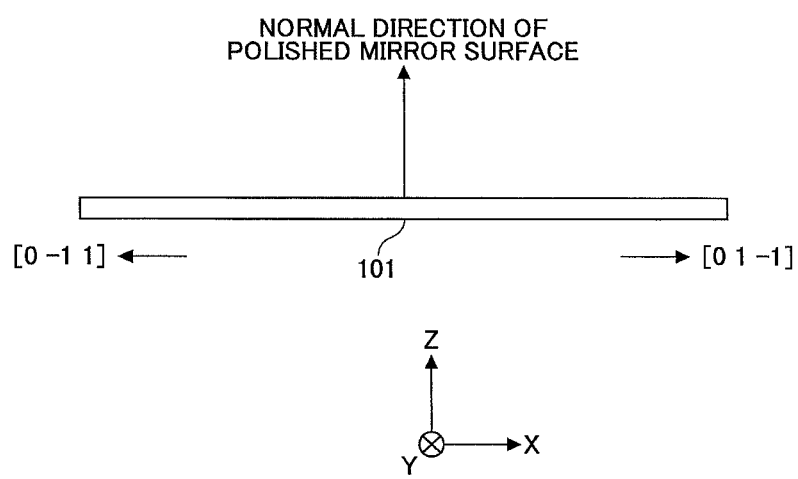

The substrate 101 has a surface that is a polished mirror surface and is a substrate of n-GaAs single crystal wherein the normal direction of the polished mirror surface inclines toward the direction of a crystallographic orientation of [1 1 1] A by 15 degrees ($\theta$=15 degrees) with respect to a crystallographic orientation of [1 0 0], as illustrated in FIG. 4A. That is, the substrate 101 is a so-called inclined substrate. Herein, arrangement is provided such that the direction of a crystallographic orientation of [0 1 −1] and the direction of a crystallographic orientation of [0 −1 1] are a +X-direction and a −X-direction, respectively, as illustrate in FIG. 4B.

The lower semiconductor DBR 103 is laminated on the surface of the substrate 101 at the side of +Z by interposing a buffer layer that is not shown in the figure and includes 42.5 pairs of a lower refractive index layer made of n-$Al_{0.93}Ga_{0.07}As$ and a higher refractive index layer made of n-$Al_{0.3}Ga_{0.7}As$. A gradient composition layer is provided between the adjacent refractive index layers. Then, any refractive index layer is designed so as to have an optical thickness of $\lambda/4$ where a half of the adjacent gradient composition layer is included and $\lambda$ is an oscillation wavelength.

The lower spacer layer 104 is laminated on the lower semiconductor DBR 103 at the side of +Z and is a layer made of non-doped $Al_{0.33}Ga_{0.67}As$.

The active layer 105 is laminated on the lower spacer layer 104 at the side of +Z and is an active layer with a triple quantum well structure which is made of GaInAsP/$Al_{0.33}Ga_{0.67}As$.

The upper spacer layer 106 is laminated on the active layer 105 at the side of +Z and is a layer made of non-doped $Al_{0.33}Ga_{0.67}As$.

The upper semiconductor DBR 107 is laminated on the upper spacer layer 106 at the side of +Z and includes 32 pairs of a lower refractive index layer made of p-$Al_{0.93}Ga_{0.07}As$ and a higher refractive index layer made of p-$Al_{0.33}Ga_{0.67}As$. A gradient composition layer is provided between the adjacent refractive index layers. Then, any refractive index layer is designed so as to have an optical thickness of λ/4 where a half of the adjacent gradient composition layer is included.

On one of the lower refractive layers in the upper semiconductor DBR 107, a layer to be oxidized selectively which is made of p-AlAs and has a thickness of 20 nm is inserted. The position of insertion of the layer to be oxidized selectively is in the lower refractive index layer of the second pair from the upper spacer layer 106.

The contact layer 109 is laminated on the upper semiconductor DBR 107 at the side of +Z and is a layer made of p-GaAs.

In addition, conveniently, plural semiconductor layers which are thus laminated on the substrate 101 are referred to as a "laminated body" below.

Figure 5:
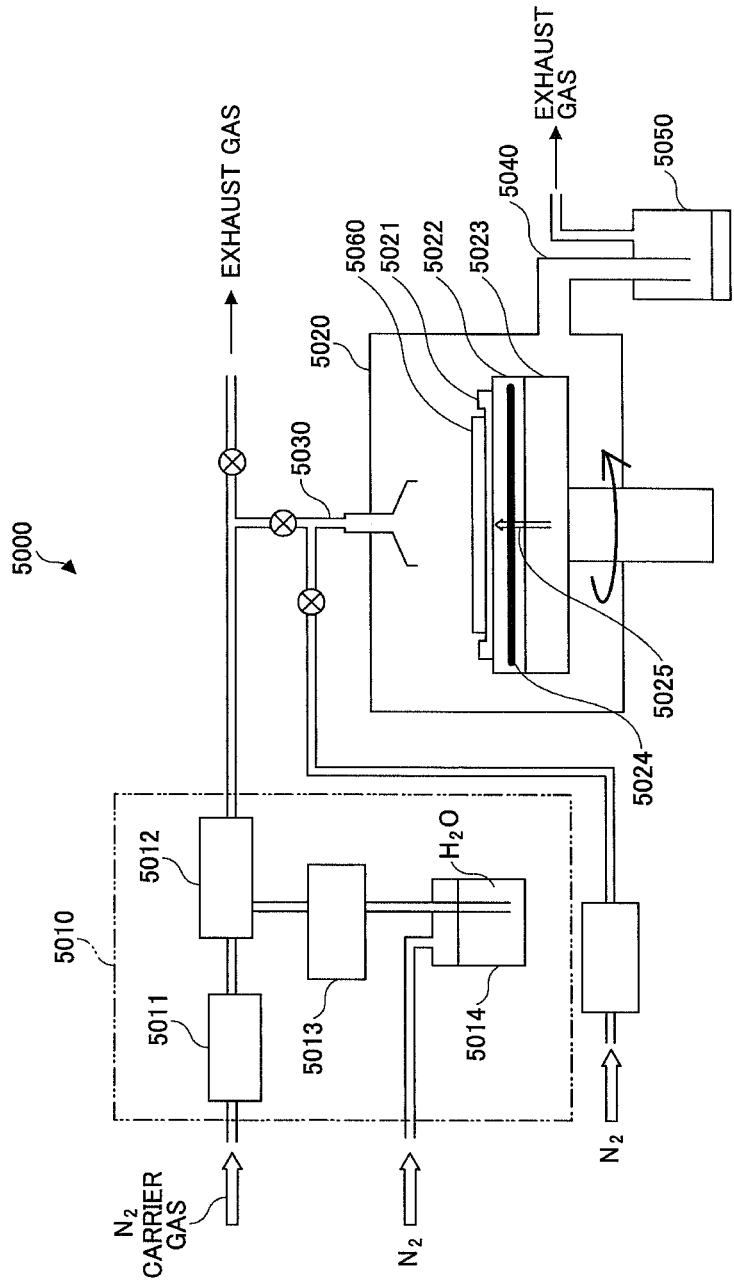
FIG. 5 is a diagram for illustrating an oxidation device used for selectively oxidizing a layer to be oxidized selectively.

Furthermore, FIG. 5 illustrates an oxidation equipment 5000 used for manufacturing the surface-emitting laser element 100. The oxidation equipment 5000 includes a water vapor feeding part 5010, a stainless steel reactor 5020, an introduction pipe 5030, an exhaust pipe 5040, a water collector 5050, a temperature controller (whose illustration is omitted in the figure), and the like.

The water vapor feeding part 5010 includes a mass flow controller 5011, a carburetor 5012, a liquid mass flow controller 5013, and a water feeder 5014. Furthermore, a tray 5021 on which an oxidation object 5060 is mounted, a disk-shaped heating table 5022 containing a ceramic heater 5024 for heating the oxidation object 5060 via the tray 5021, a thermocouple 5025 for measuring the temperature of the oxidation object 5060, and a rotatable base 5023 holding the heating table 5022 are contained in the stainless steel reactor 5020.

The temperature controller controls an electric current (or electric voltage) applied to the ceramic heater 5024 while an output signal of the thermocouple 5025 is monitored, and retains the oxidation object 5060 at a specified temperature (retention temperature) for a specified time period (retention time).

The operation of the water vapor feeding part 5010 will be described briefly. When nitrogen ($N_2$) gas is introduced into the water feeder 5014, the flow rate of water ($H_2O$) is controlled by the liquid mass flow controller 5013 and fed into the carburetor 5012, thereby becoming water vapor. When $N_2$ carrier gas is introduced, its flow rate is controlled by the mass flow controller 5011 and it is fed into the carburetor 5012. Then, $N_2$ carrier gas containing water vapor from the carburetor 5012 is fed into the stainless steel reactor 5020 through the introduction pipe 5030.

The $N_2$ carrier gas containing water vapor fed into the stainless steel reactor 5020 is fed into the surrounding of the oxidation object 5060. Thereby, the oxidation object 5060 is subjected to water vapor atmosphere so that the oxidation object 5060 is oxidized. Afterwards, the $N_2$ carrier gas containing water vapor is exhausted through the exhaust pipe 5040 and the water collector 5050.

Figure 6A:
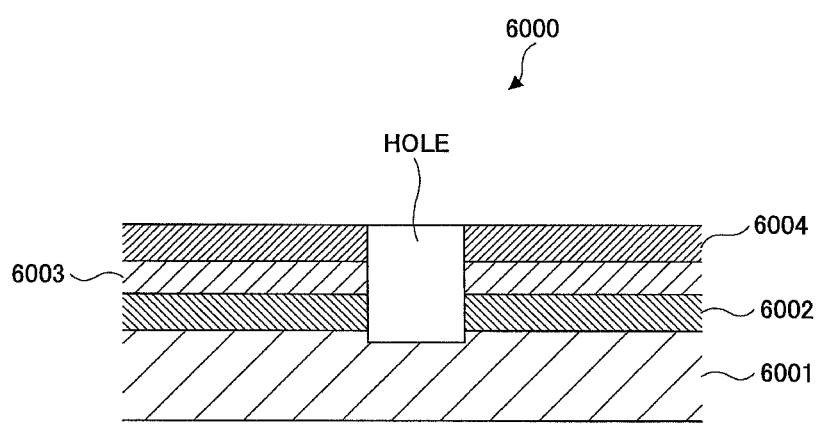
FIG. 6A and FIG. 6B are diagrams for illustrating a sample used for obtaining the in-plane direction dependency of the oxidation rate of a layer to be oxidized selectively, respectively.
Figure 6B:
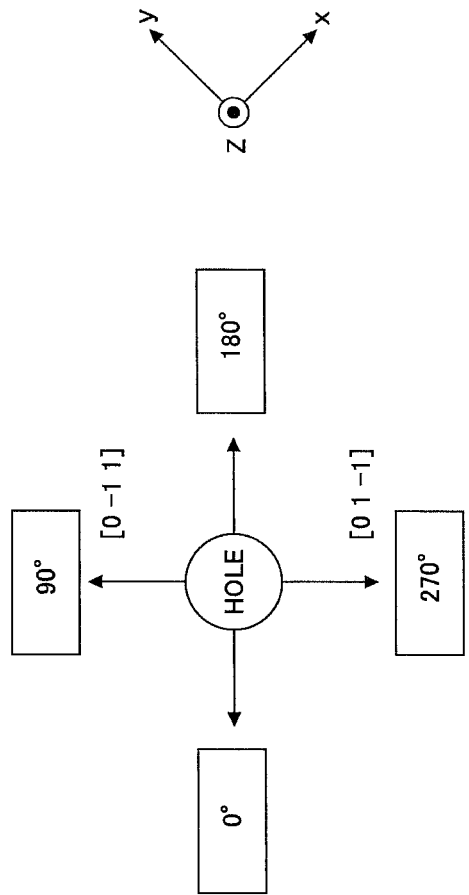
Figure 7:
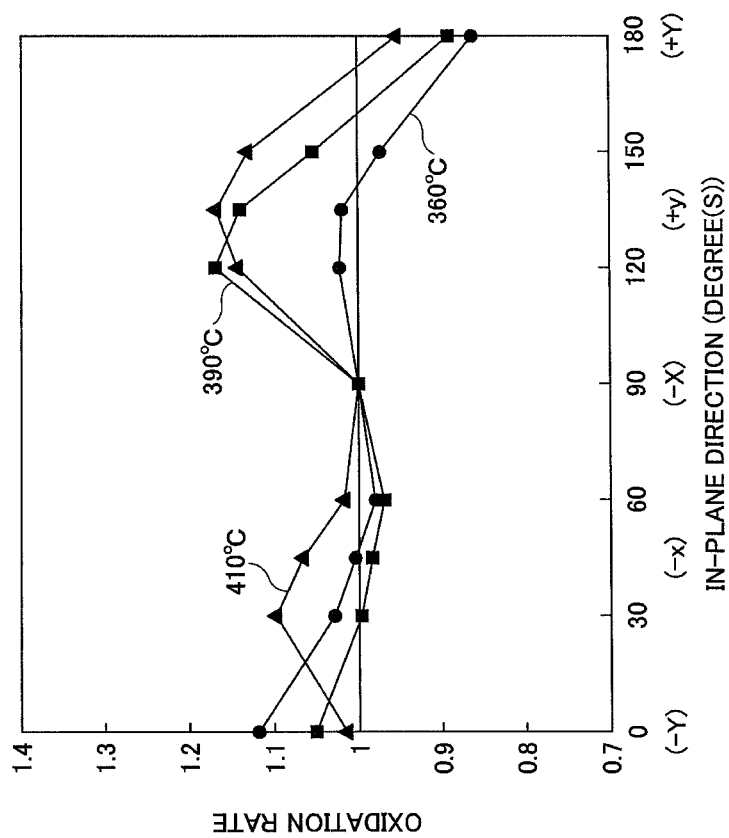
FIG. 7 is a diagram for illustrating the relation between the oxidation rate and in-plane direction of a layer to be oxidized selectively.
Figure 8B:
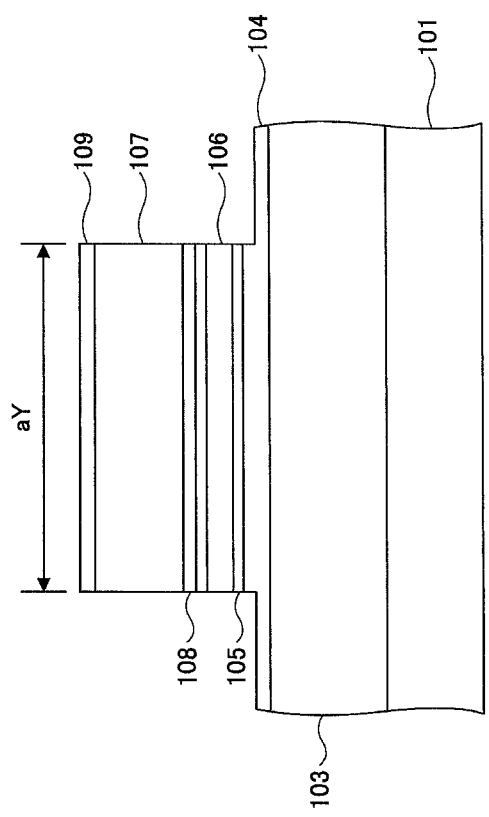

For a preparatory experiment, a GaAs layer 6002, an AlAs layer 6003 with a thickness of 20 nm, and a GaAs layer 6004 are sequentially laminated on a substrate 6001 that is an inclined substrate similar to the substrate 101, by means of epitaxial growth, as illustrated in FIG. 6A, and a sample 6000 in which a hole with a diameter of 5 μm is formed by a dry-etching method, as the oxidation object 5060, is oxidized by the oxidation equipment 5000. FIG. 7 illustrates the relation between the oxidation rate and in-plane direction of the AlAs layer 6003 in this case. The flow rate of water is 60 g/hr and the flow rate of $N_2$ carrier gas is 20 SLM. The temperature in FIG. 7 is a retention temperature, and in regard to the in-plane directions, a −Y direction, a −X direction, and a +Y direction are 0°, 90°, and 180°, as illustrated in FIG. 6B. Additionally, the oxidation rate in FIG. 7 is normalized such that the oxidation rate is 1 when the in-plane direction is 90°. Furthermore, conveniently, axes provided by counterclockwise rotating the X axis and the Y-axis by 45° around the Z-axis are an x-axis and a y-axis, respectively, below, as illustrated in FIG. 6B.

Furthermore, the crystallographic direction dependency of the oxidation rate is not n-fold symmetric ($n \geq 2$) but a mirror plane symmetric with respect to (0 1 −1) plane, although its illustration is not provided in the figure. For example, the oxidation rate for the −x direction (45°) and the oxidation rate for the −y direction (315°), the oxidation rate for the −X direction (90°) and the oxidation rate for the +X direction (270°), or the oxidation rate for the +y direction (135°) and the oxidation rate for the +x direction (225°) exhibited almost the same values.

For example, when the retention temperature is 390° C., the oxidation rate for the −X direction, the oxidation rate for the −Y direction, and the oxidation rate for the +Y direction are 1.00, 1.04, and 0.85, respectively, in the case where the oxidation rate for the +X direction is 1.00. That is, the ratio of an average oxidation rate for the Y-axis direction to an average oxidation rate for the X-axis direction is 0.945.

Next, a method for manufacturing the surface-emitting laser element 100 will be described briefly.

(1) The above-mentioned laminated body is fabricated by means of crystal growth based on an organo-metallic chemical vapor deposition (OMCVD) method or a molecular beam epitaxial growth method (MBE method).

Herein, trimethyl aluminum (TMA), trimethyl gallium (TMG), or trimethyl indium (TMI) is used for a Group III raw material, and phosphine ($PH_3$) or arsine ($AsH_3$) is used for a Group V raw material. Furthermore, carbon tetrabromide ($CBr_4$) or dimethyl zinc (DMZn) is used for a p-type dopant raw material and hydrogen selenide ($H_2Se$) is used for an n-type dopant raw material.

(2) A rectangular resist pattern corresponding to a desired mesa shape is formed on a surface of the laminated body.

(3) A square pillar-shaped mesa is formed by an ECR etching method using $Cl_2$ gas while the resist pattern is a photomask. Herein, the length aX of the outline of the mesa in the X-axis directions (see FIG. 8A) is 28.0 μm and its length aY in the Y-axis directions (see FIG. 8B) is 26.7 μm. That is, aX>aY. Additionally, the bottom of etching is positioned in the lower spacer layer 104.

(4) The photomask is removed.

(5) The laminated body on which the mesa has been formed is set in the oxidation equipment 5000 and selective oxidation of Al (aluminum) is conducted.

In the present embodiment, the conditions (oxidation conditions) that the floe rate of water was 60 g/hr, the flow rate of $N_2$ carrier gas was 20 SLM, the retention temperature was 390° C., and the retention time was 40.1 minutes were used by way of example. Thereby, Al in the layer to be oxidized selectively is selectively oxidized from the peripheral part of the mesa and an unoxidized area 108b surrounded by an oxidation layer 108a remains on the central portion of the mesa (see FIG. 3). That is, a so-called oxidized and narrowed structure is formed such that the path of driving current of a light-emitting part is limited to the central portion of the mesa. The unoxidized area 108b is an electric current passage area (electric current injection area).

In the present embodiment, the dimensions of the mesa with respect to the X-axis directions and Y-axis directions are set such that the size of the electric current passage area 108b is approximately 4.0 μm in each of the X-axis directions and Y-axis directions, based on the result of the above-mentioned preparatory experiment.

(6) A protective layer 111 made of SiN or $SiO_2$ is formed by using a chemical vapor deposition method (CVD method) (see FIG. 3).

(7) Planarization is conducted with polyimide 112 (see FIG. 3).

(8) Window opening for a P-side electrode contact is conducted on the top of the mesa. Herein, after a mask of photoresist is applied, the opening on the top of the mesa is exposed to light such that the photoresist on such a part is removed, and opening is made by etching the polyimide 112 and the protective layer 111 in a BHF.

(9) A square-shaped resist pattern with a side length of 10 μm is formed on an area for a light emitting part on the top of the mesa and vapor deposition of a p-side electrode material is conducted. For a p-side electrode material, a multilayer film composed of Cr/AuZn/Au or a multilayer film composed of Ti/Pt/Au is used.

(10) The electrode material of the light-emitting part is lifted off so as to form a p-side electrode 113 (see FIG. 3).

(11) After the back side of the substrate 101 is polished up to a predetermined thickness (for example, approximately 100 μm), an n-side electrode 114 is formed (see FIG. 3). Herein, an n-side electrode 114 is a multilayer film composed of AuGe/Ni/Au.

(12) The p-side electrode 113 and the n-side electrode 114 are provided with ohmic conduction by means of annealing. Thereby, the mesa is a light-emitting part.

(13) Cutting into chips is conducted.

Figure 9:
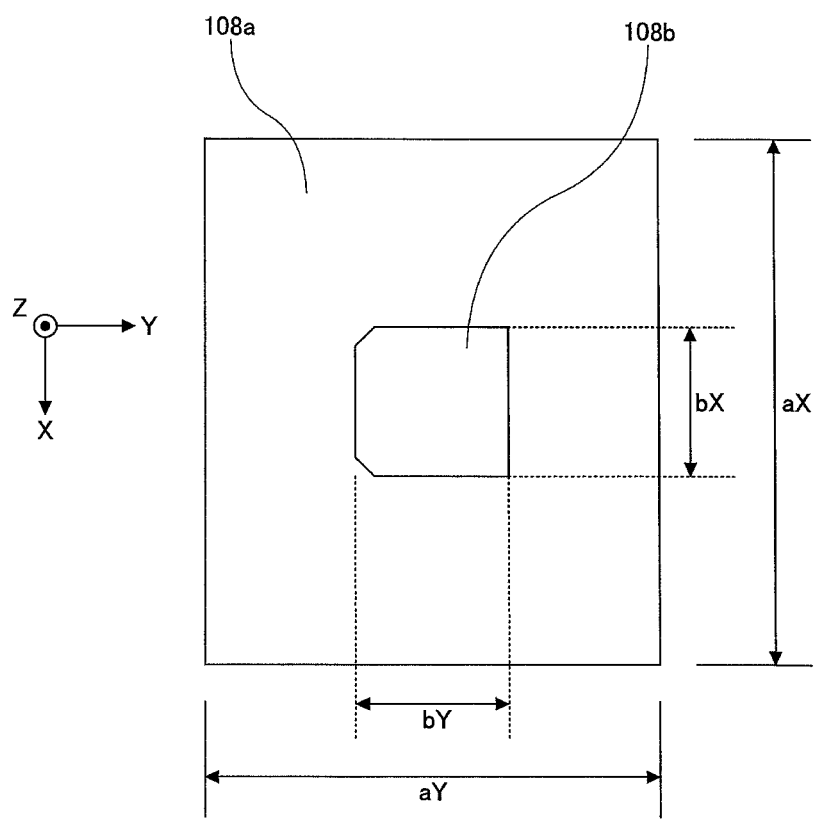
FIG. 9 is a diagram for illustrating an oxidized and narrowed structure.

When the oxidized and narrowed structure of the surface-emitting laser element 100 manufactured as described above was observed by an SEM (scanning electron microscope), an electric current passage area 108b was formed to have a shape of nearly square in which its length bX in the X-axis directions was 4.10 μm and its length bY in the Y-axis directions was 4.00 μm (largest width/smallest width=1.03) and of which two corners at the side of −Y were beveled, as illustrated in FIG. 9.

The reason why the two corners were beveled is that the oxidation rates for near the +x direction and near the +y direction were approximately 1.1 times the oxidation rates for the +Y direction, +X direction and −X direction.

The shape of the electric current passage area 108b is mirror-image-symmetric with respect to (0 1 −1) plane passing through the center of the electric current passage area 108b.

Light with polarization directions that were the Y-axis directions was stably emitted from the surface-emitting laser element 100. Furthermore, output light from the surface-emitting laser element 100 was provided such that its FFP was axially symmetric with respect to the Z-axis directions and its divergence angle was 7.0°, while the cross-sectional shape of a light beam was circular.

Additionally, when each of the lengths of the mesa in the X-axis directions and Y-axis directions was 28.0 μm for comparison, the shape of an electric current passage area was a hexagonal shape such that two corners of a rectangle in which its length in the X-axis directions was 4.0 μm and its length in the Y-axis directions was 5.3 μm (largest width/smallest width=1.33) were beveled. Then, output light was provided such that its divergence angle in the X-axis directions was 7.0° and its divergence angle in the Y-axis directions was 5.0°, while the cross-sectional shape of a light beam was elliptical.

As described above, a mesa (mesa structure) having an oxidized and narrowed structure is formed on the substrate 101 in which the normal direction of its principal plane inclines toward the direction of a crystallographic orientation of [1 1 1] by 15 degrees with respect to the direction of a crystallographic orientation of [1 0 0], due to the surface-emitting laser 100 according to the present embodiment. Then, a cross section of the mesa which is parallel to the substrate 101 is provided such that its length aX in the X-axis directions (first directions) passing through the center of the electric current passage area 108b is more than its length in the Y-axis directions (second directions) passing through the center of the electric current passage area 108b. In this case, the shape of the electric current passage area 108b was mirror-image-symmetric with respect to (0 1 −1) plane passing through the center of the electric current passage area 108b and was nearly square if beveled portions were neglected. Thus, it is possible to increase the stability of a light polarization direction and to make the cross-sectional shape of an output light beam be nearly circular while no cost increase is caused.

Because the light source 14 has the surface-emitting laser 100 in the optical scanning device 1010 according to the present embodiment, it is possible to conduct optical scanning with a high precision without causing cost increase.

Because the laser printer 1000 according to the present embodiment includes the optical scanning device 1010, it is possible to form a high-quality image without causing cost increase.

Additionally, although the case of an electric current passage area that is nearly square and has two beveled corners has been described in the present embodiment, the present invention is not limited to it and a circular shape or any of shapes having n-fold symmetry, wherein n is an integer of 4 or greater, is allowed. For example, regular polygons such as a regular pentagon, a regular hexagon, a regular octagon, and a regular dodecagon (which include nearly regular polygons) are also allowed.

[Surface-Emitting Laser Element 100A]

Figure 10:
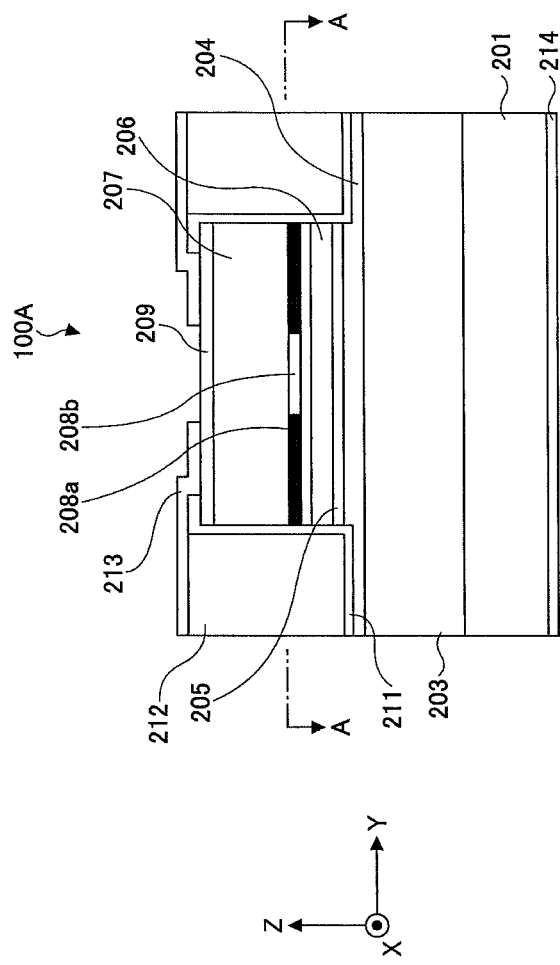
FIG. 10 is a diagram for illustrating variation example 1 of a surface-emitting laser element.

Furthermore, a surface-emitting laser 100A as illustrated in FIG. 10 may be used instead of the above-mentioned surface-emitting laser 100.

The surface-emitting laser element 100A is a surface-emitting laser whose design oscillation wavelength is a 780 nm band, and includes a substrate 201, a lower semiconductor DBR 203, a lower spacer layer 204, an active layer 205, an upper spacer layer 206, an upper semiconductor DBR 207, a contact layer 209, and the like.

Figure 11A:
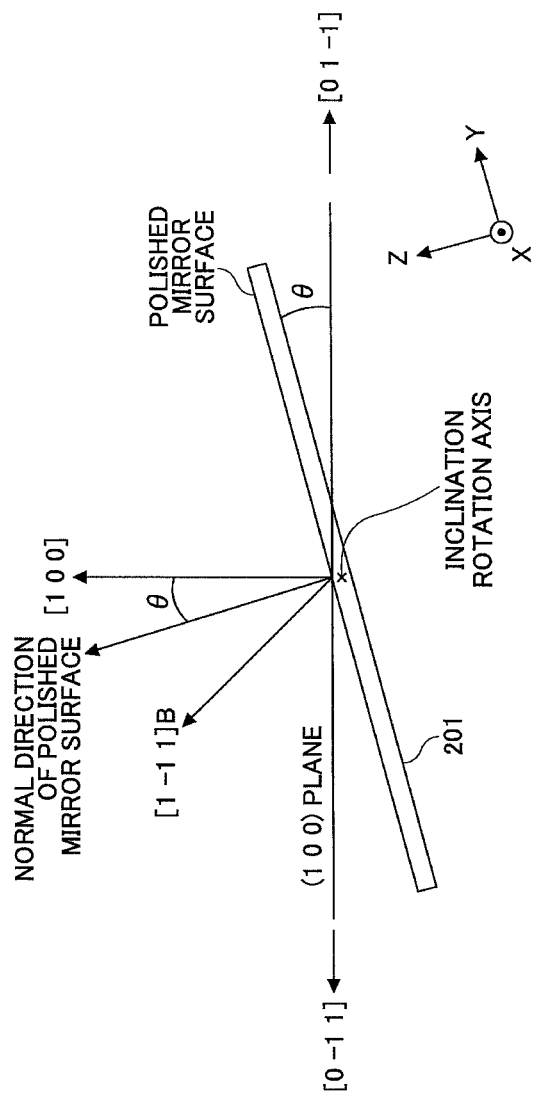
FIG. 11A and FIG. 11B are diagrams for illustrating a substrate in FIG. 10, respectively.
Figure 11B:
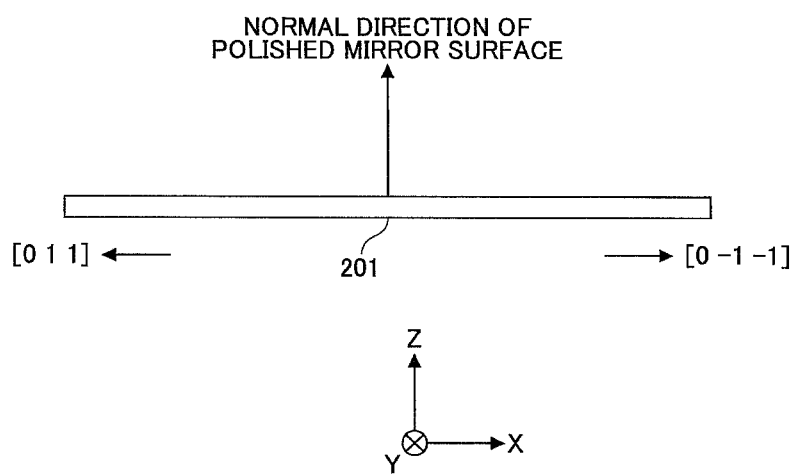

The substrate 201 has a surface that is a polished mirror surface, and is an n-GaAs single crystal substrate in which the normal direction of its polished mirror surface inclines toward the direction of a crystallographic orientation of [1 −1 1] B by 15 degrees (θ=15 degrees) with respect to the direction of a crystallographic orientation of [1 0 0], as illustrated in FIG. 11A. That is, the substrate 201 is a so-called inclined substrate. Herein, arrangement is provided such that the direction of a crystallographic orientation of [0 −1 −1] is the +X direction and the direction of a crystallographic orientation of [0 1 1] is the −X direction, as illustrated in FIG. 11B.

The lower semiconductor DBR 203 is laminated on the surface of the substrate 201 at the side of +Z by interposing a buffer layer that is not shown in the figure and includes 42.5 pairs of a lower refractive index layer made of $n-Al_{0.93}Ga_{0.07}As$ and a higher refractive index layer made of $n-Al_{0.3}Ga_{0.7}As$. A gradient composition layer is provided between the adjacent refractive index layers. Then, any refractive index layer is designed so as to have an optical thickness of λ/4 where a half of the adjacent gradient composition layer is included.

The lower spacer layer 204 is laminated on the lower semiconductor DBR 203 at the side of +Z and is a layer made of non-doped $Al_{0.33}Ga_{0.67}As$.

The active layer 205 is laminated on the lower spacer layer 204 at the side of +Z and is an active layer with a triple quantum well structure which is made of GaInAsP/$Al_{0.33}Ga_{0.67}As$.

The upper spacer layer 206 is laminated on the active layer 205 at the side of +Z and is a layer made of non-doped $Al_{0.33}Ga_{0.67}As$.

The upper semiconductor DBR 207 is laminated on the upper spacer layer 206 at the side of +Z and includes 32 pairs of a lower refractive index layer made of p-$Al_{0.93}Ga_{0.07}As$ and a higher refractive index layer made of p-$Al_{0.33}Ga_{0.67}As$. A gradient composition layer is provided between the adjacent refractive index layers. Then, any refractive index layer is designed so as to have an optical thickness of $\lambda/4$ where a half of the adjacent gradient composition layer is included.

On one of the lower refractive layers in the upper semiconductor DBR 207, a layer to be oxidized selectively which is made of p-$Al_{0.99}Ga_{0.01}As$ and has a thickness of 30 nm is inserted. The position of insertion of the layer to be oxidized selectively is in the lower refractive index layer of the second pair from the upper spacer layer 206.

The contact layer 209 is laminated on the upper semiconductor DBR 207 at the side of +Z and is a layer made of p-GaAs.

Additionally, in FIG. 10, reference numeral 208a, reference numeral 211, reference numeral 212, reference numeral 213, and reference numeral 214 denote an Al oxidation layer, a protective layer, a polyimide, a p-side electrode, and an n-side electrode, respectively.

It is possible to manufacture the surface-emitting laser element 100A similarly to the above-mentioned surface-emitting laser element 100. However, oxidation conditions were provided such that the flow rate of water was 30 g/hr, the flow rate of $N_2$ carrier gas was 20 SLM, the retention temperature was 400° C., and the retention time was 65.0 minutes. Also, the dimensions of the mesa with respect to the X-axis directions and Y-axis directions were set such that the size of an electric current passage area 208b was approximately 4.5 µm in each of the X-axis directions and Y-axis directions, based on the result of a preparatory experiment similar to the above-mentioned one.

Specifically, when the oxidation rate for the +X direction is 1.00 in the oxidation rate for each crystallographic orientation on the above-mentioned oxidation conditions, the oxidation rate for the −X direction, the oxidation rate for the −Y direction, and the oxidation rate for the +Y direction are 1.00, 0.88, and 1.03, respectively, and the ratio of an average oxidation rate for the Y-axis directions to an average oxidation rate for the X-axis directions is 0.955. Herein, the length aX of the outline of a mesa in the X-axis directions (see FIG. 12) was 26.5 µm and its length aY in the Y-axis directions (see FIG. 12) was 25.5 µm. That is, aX>aY.

Figure 12:
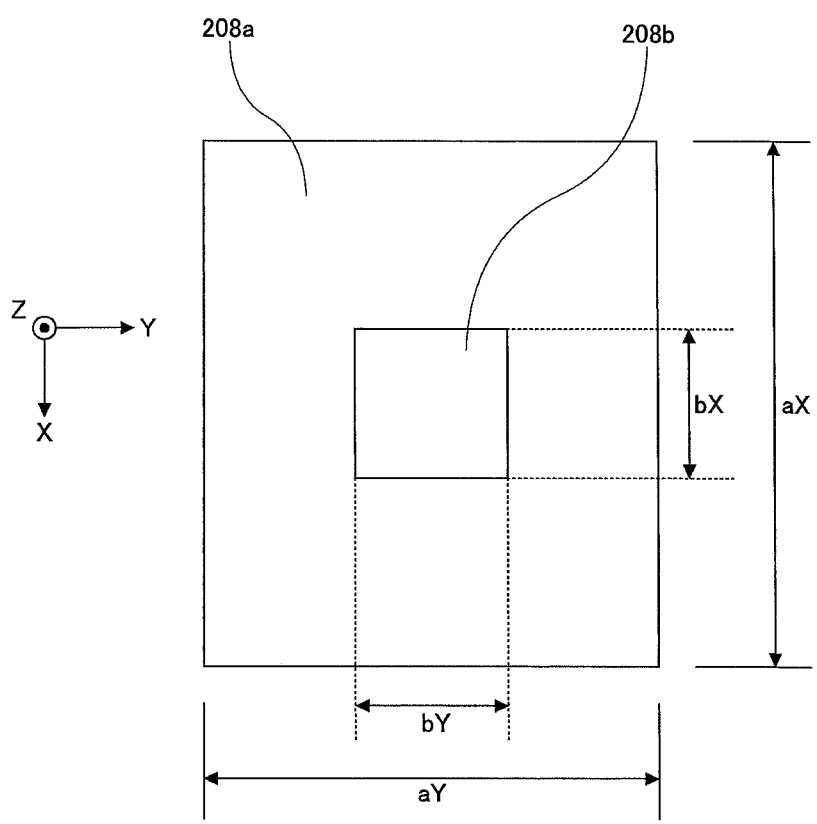
FIG. 12 is a diagram for illustrating an oxidized and narrowed structure of variation example 1 of a surface-emitting laser element.

When an oxidized and narrowed structure of the surface-emitting laser element 100A was observed by an SEM, an electric current passage area 208b was formed to have a shape of nearly square in which its length bX in the X-axis directions was 4.40 µm and its length bY in the Y-axis directions was 4.80 µm (largest width/smallest width=1.09), as illustrated in FIG. 12.

Then, the shape of the electric current passage area 208b was mirror-image-symmetric with respect to (0 1 −1) plane passing through the center of the electric current passage area 208b.

Output light whose polarization directions were stable in the X-axis directions was obtained from the surface-emitting laser element 100A. Furthermore, output light was provided such that its divergence angle for the X-axis directions was 6.5° and its divergence angle for the Y-axis directions was 6.1°, wherein the cross-sectional shape of a light beam was nearly circular.

Additionally, when each of the lengths of the mesa in the X-axis directions and Y-axis directions was 32.5 µm for comparison, the shape of an electric current passage area was a rectangular shape such that its length bX in the X-axis directions was 4.5 µm and its length bY in the Y-axis directions was 5.5 µm (largest width/smallest width=1.22). Then, output light was provided such that its divergence angle in the X-axis directions was 6.4° and its divergence angle in the Y-axis directions was 4.8°, while the cross-sectional shape of a light beam was elliptical.

Furthermore, although the case where the oscillation wavelength of a light-emitting part is a 780 nm band has been described in the present embodiment, the present invention is not limited to it. The oscillation of a light-emitting part may be changed depending on the characteristics of a photoconductor.

Moreover, it is possible to use each of the above-mentioned light-emitting laser elements for applications other than an image forming apparatus. In that case, the oscillation wavelength may be a wavelength band such as a 650 nm band, an 850 nm band, a 980 nm band, a 1.3 µm band, or a 1.5 µm band, depending on that application.

[Surface-Emitting Laser Element 100B]

Figure 13:
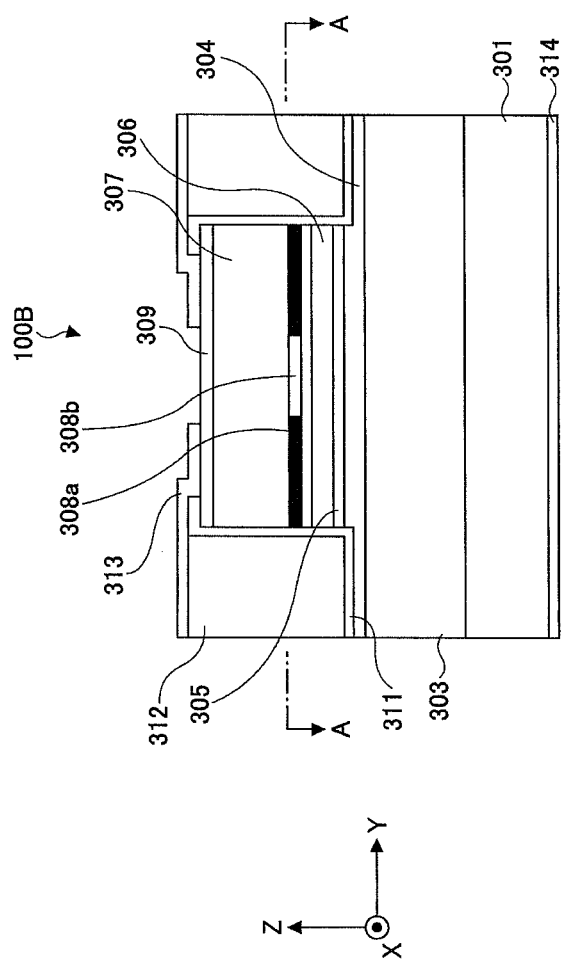
FIG. 13 is a diagram for illustrating variation example 2 of a surface-emitting laser element.

For example, FIG. 13 illustrates a surface-emitting laser 100B whose design oscillation wavelength is an 850 nm band.

The surface-emitting laser element 100B includes a substrate 301, a lower semiconductor DBR 303, a lower spacer layer 304, an active layer 305, an upper spacer layer 306, an upper semiconductor DBR 307, a contact layer 309, and the like.

The substrate 301 is an inclined substrate similar to the above-mentioned substrate 101.

The lower semiconductor DBR 303 is laminated on the surface of the substrate 301 at the side of +Z by interposing a buffer layer that is not shown in the figure and includes 42.5 pairs of a lower refractive index layer made of n-$Al_{0.09}Ga_{0.1}As$ and a higher refractive index layer made of n-$Al_{0.1}Ga_{0.09}As$ A gradient composition layer with a thickness of 20 nm whose composition gradually varies from one composition to the other composition is provided between the adjacent refractive index layers in order to reduce its electrical resistance. Then, any refractive index layer is designed so as to have an optical thickness of $\lambda/4$ where a half of the adjacent gradient composition layer is included and $\lambda$ is an oscillation wavelength.

The lower spacer layer 304 is laminated on the lower semiconductor DBR 303 at the side of +Z and is a layer made of non-doped $Al_{0.5}Ga_{0.5}As$.

The active layer 305 is laminated on the lower spacer layer 304 at the side of +Z and is an active layer with a triple quantum well structure which is made of GaAs/$Al_{0.5}Ga_{0.5}As$.

The upper spacer layer 306 is laminated on the active layer 305 at the side of +Z and is a layer made of non-doped $Al_{0.5}Ga_{0.5}As$.

The part composed of the lower spacer layer 304, active layer 305, and upper spacer layer 306 is also referred to as a resonator structure and is designed such that its thickness is an optical thickness of one wavelength. Furthermore, the active layer 305 is provided at the center of resonator structure which is a position corresponding to a loop in the distribution of a standing wave of electric field, so as to obtain a high probability of stimulated emission.

The upper semiconductor DBR 307 is laminated on the upper spacer layer 306 at the side of +Z and includes 32 pairs of a lower refractive index layer made of p-$Al_{0.9}Ga_{0.1}As$ and a higher refractive index layer made of p-$Al_{0.1}Ga_{0.9}As$. A gradient composition layer with a thickness of 20 nm whose composition gradually varies from one composition to the other composition is provided between the adjacent refractive index layers in order to reduce its electrical resistance. Then, any refractive index layer is designed so as to have an optical thickness of λ/4 where a half of the adjacent gradient composition layer is included and λ is an oscillation wavelength.

On one of the lower refractive layers in the upper semiconductor DBR 307, a layer to be oxidized selectively which is made of p-AlAs and has a thickness of 20 nm is inserted. The position of insertion of the layer to be oxidized selectively is in the lower refractive index layer of the second pair from the upper spacer layer 306.

The contact layer 309 is laminated on the upper semiconductor DBR 307 at the side of +Z and is a layer made of p-GaAs.

Additionally, in FIG. 13, reference numeral 308a, reference numeral 311, reference numeral 312, reference numeral 313, and reference numeral 314 denote an Al oxidation layer, a protective layer, a polyimide, a p-side electrode, and an n-side electrode, respectively.

It is possible to manufacture the surface-emitting laser element 100B similarly to the above-mentioned surface-emitting laser element 100. However, oxidation conditions were provided such that the flow rate of water was 60 g/hr, the flow rate of $N_2$ carrier gas was 20 SLM, the retention temperature was 360° C., and the retention time was 110.5 minutes. Then, the dimensions of the mesa with respect to the X-axis directions and Y-axis directions were set such that the size of an electric current passage area 308b was approximately 4.0 µm in each of the X-axis directions and Y-axis directions, based on the result of the above-mentioned preparatory experiment.

Specifically, when the oxidation rate for the +X direction is 1.00 in the oxidation rate for each crystallographic orientation on the above-mentioned oxidation conditions, the oxidation rate for the −X direction, the oxidation rate for the −Y direction, and the oxidation rate for the +Y direction are 1.00, 1.09, and 0.82, respectively, and the ratio of an average oxidation rate for the Y-axis directions to an average oxidation rate for the X-axis directions is 0.955. Herein, the length aX of the outline of a mesa in the X-axis directions (see FIG. 14) was 28.0 µm and its length aY in the Y-axis directions (see FIG. 14) was 26.9 µm. That is, aX>aY.

Figure 14:
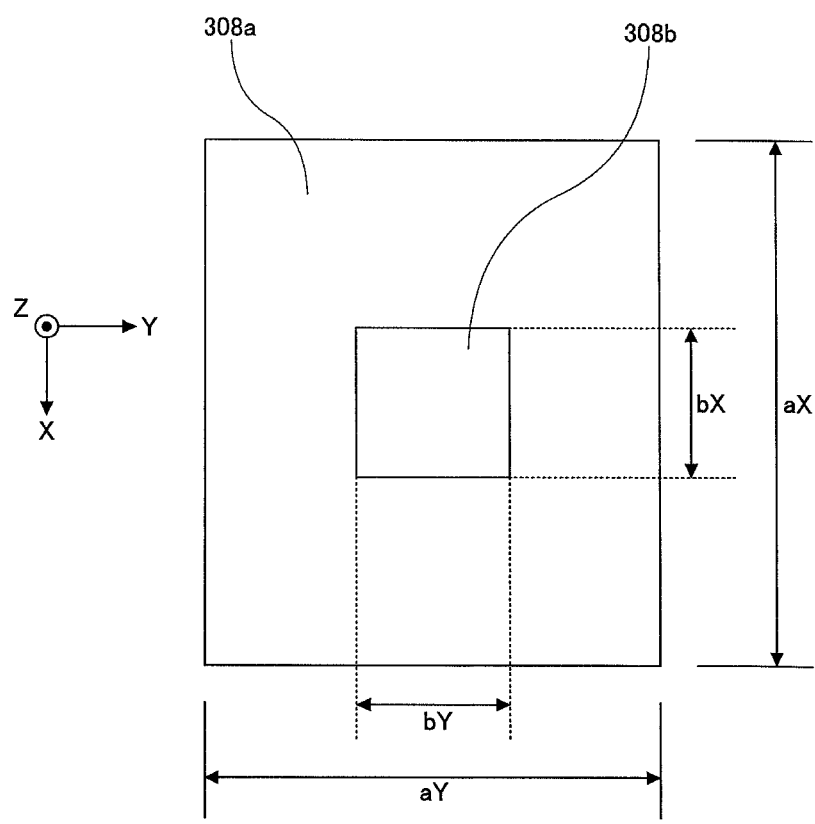
FIG. 14 is a diagram for illustrating an oxidized and narrowed structure of variation example 2 of a surface-emitting laser element.

When an oxidized and narrowed structure of the surface-emitting laser element 100B was observed by an SEM (scanning electron microscope), an electric current passage area 308b was formed to have a shape of square in which each of its length bX in the X-axis directions and its length bY in the Y-axis directions was 4.00 µm (largest width/smallest width=1.00), as illustrated in FIG. 14.

Then, the shape of the electric current passage area 308b was mirror-image-symmetric with respect to (0 1 −1) plane passing through the center of the electric current passage area 308b.

Light with polarization directions that were the Y-axis directions was stably emitted from the surface-emitting laser element 100B. Furthermore, output light from the surface-emitting laser element 100B was provided such that its FFP was axially symmetric with respect to the Z-axis directions and its divergence angle was 7.0°, wherein the cross-sectional shape of a light beam was circular.

Additionally, when each of the lengths of the mesa in the X-axis directions and Y-axis directions was 28.0 µm for comparison, the shape of an electric current passage area was a rectangular shape such that its length in the X-axis directions was 4.0 µm and its length in the Y-axis directions was 5.1 µm (largest width/smallest width=1.28). Then, output light was provided such that its divergence angle in the X-axis directions was 7.0° and its divergence angle in the Y-axis directions was 5.5°, while the cross-sectional shape of a light beam was elliptical.

[Surface-Emitting Laser Element 100C]

Figure 15:
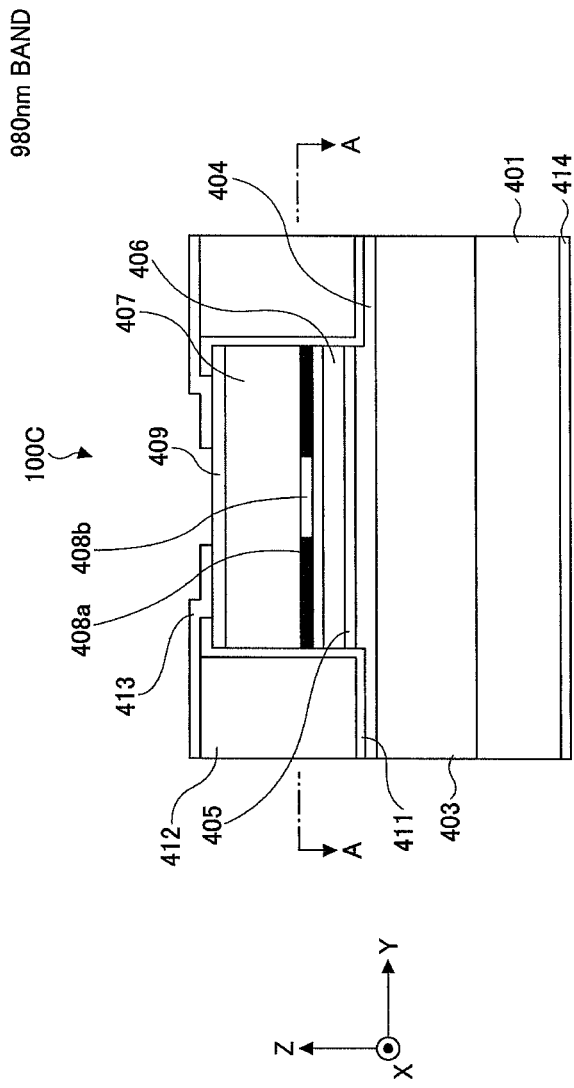
FIG. 15 is a diagram for illustrating variation example 3 of a surface-emitting laser element.

FIG. 15 illustrates a surface-emitting laser 100C whose design oscillation wavelength is an 980 nm band.

The surface-emitting laser element 100C includes a substrate 401, a lower semiconductor DBR 403, a lower spacer layer 404, an active layer 405, an upper spacer layer 406, an upper semiconductor DBR 407, a contact layer 409, and the like.

Figure 16B:
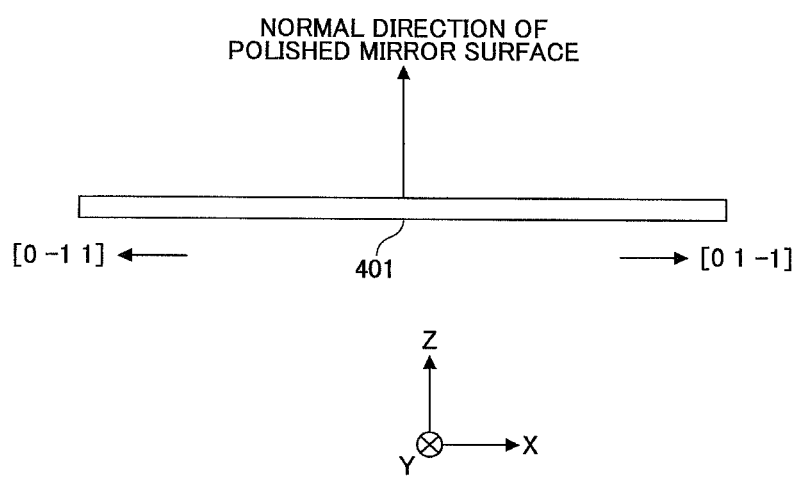

The substrate 401 has a surface that is a polished mirror surface and is a substrate of n-GaAs single crystal wherein the normal direction of the polished mirror surface inclines toward the direction of a crystallographic orientation of [1 −1 −1] A by 15 degrees (θ=15 degrees) with respect to a crystallographic orientation of [1 0 0], as illustrated in FIG. 16A. That is, the substrate 401 is a so-called inclined substrate. Herein, arrangement is provided such that the direction of a crystallographic orientation of [0 1 −1] is the +X direction and the direction of a crystallographic orientation of [0 −1 1] is the −X direction, as illustrated in FIG. 16B.

The lower semiconductor DBR 403 is laminated on the surface of the substrate 401 at the side of +Z by interposing a buffer layer that is not shown in the figure and includes 38.5 pairs of a lower refractive index layer made of n-$Al_{0.09}Ga_{0.1}As$ and a higher refractive index layer made of n-GaAs. A gradient composition layer is provided between the adjacent refractive index layers. Then, any refractive index layer is designed so as to have an optical thickness of λ/4 where a half of the adjacent gradient composition layer is included.

The lower spacer layer 404 is laminated on the lower semiconductor DBR 403 at the side of +Z and is a layer made of non-doped GaAs.

The active layer 405 is laminated on the lower spacer layer 404 at the side of +Z and is a TQW active layer made of GaInAs/GaAs.

The upper spacer layer 406 is laminated on the active layer 405 at the side of +Z and is a layer made of non-doped GaAs.

The upper semiconductor DBR 407 is laminated on the upper spacer layer 406 at the side of +Z and includes 30 pairs of a lower refractive index layer made of p-$Al_{0.9}Ga_{0.1}As$ and a higher refractive index layer made of p-GaAs. A gradient composition layer is provided between the adjacent refractive index layers. Then, any refractive index layer is designed so as to have an optical thickness of λ/4 where a half of the adjacent gradient composition layer is included.

On one of the lower refractive layers in the upper semiconductor DBR 407, a layer to be oxidized selectively which is made of p-AlAs and has a thickness of 20 nm is inserted. The position of insertion of the layer to be oxidized selectively is in the lower refractive index layer of the third pair from the upper spacer layer 406.

The contact layer 409 is laminated on the upper semiconductor DBR 407 at the side of +Z and is a layer made of p-GaAs.

Additionally, in FIG. 15, reference numeral 408a, reference numeral 411, reference numeral 412, reference numeral 413, and reference numeral 414 denote an Al oxidation layer, a protective layer, a polyimide, a p-side electrode, and an n-side electrode, respectively.

It is possible to manufacture the surface-emitting laser element 100C similarly to the above-mentioned surface-emitting laser element 100. However, oxidation conditions were provided such that the flow rate of water was 60 g/hr, the flow rate of $N_2$ carrier gas was 20 SLM, the retention temperature was 410° C., and the retention time was 12.5 minutes. Then, the dimensions of the mesa with respect to the X-axis directions and Y-axis directions were set such that the size of an electric current passage area 408b was approximately 4.0 μm in each of the X-axis directions and Y-axis directions, based on the result of a preparatory experiment similar to the above-mentioned one.

Specifically, when the oxidation rate for the +X direction is 1.00 in the oxidation rate for each crystallographic orientation on the above-mentioned oxidation conditions, the oxidation rate for the −X direction, the oxidation rate for the −Y direction, and the oxidation rate for the +Y direction are 1.00, 0.91, and 1.01, respectively, and the ratio of an average oxidation rate for the Y-axis directions to an average oxidation rate for the X-axis directions is 0.96. Herein, the length aX of the outline of a mesa in the X-axis directions (see FIG. 17) was 28.0 μm and its length aY in the Y-axis directions (see FIG. 17) was 27.0 μm. That is, aX>aY.

Figure 17:
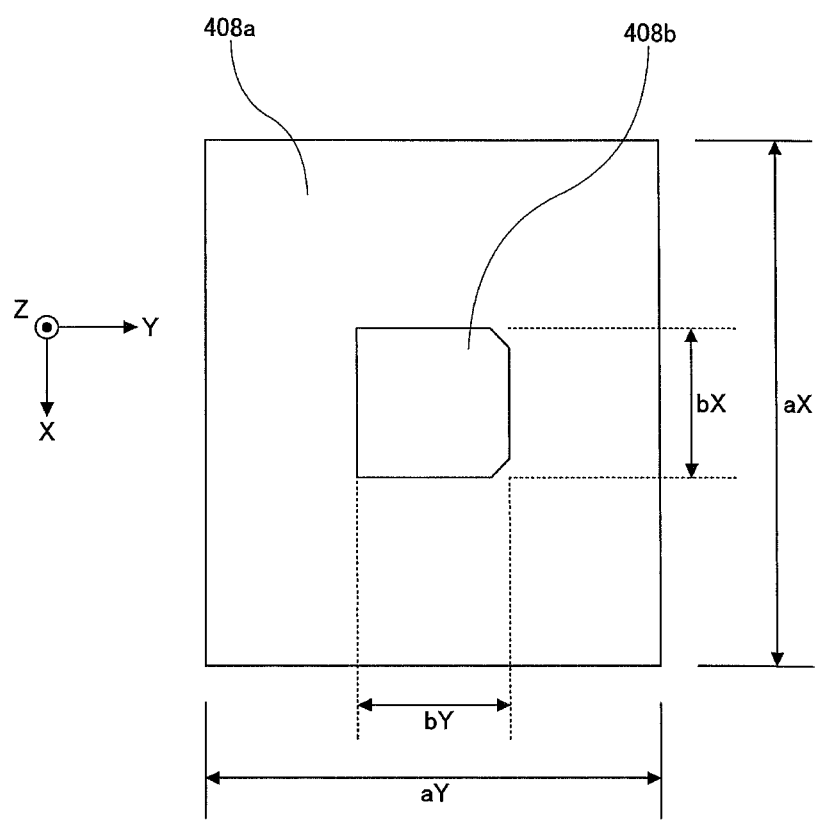
FIG. 17 is a diagram for illustrating an oxidized and narrowed structure (example 1) of variation example 3 of a surface-emitting laser element.

When an oxidized and narrowed structure of the surface-emitting laser element 100C was observed by an SEM, an electric current passage area 408b was formed to have a shape of nearly square in which its length bX in the X-axis directions was 4.00 μm and its length bY in the Y-axis directions was 4.15 μm (largest width/smallest width=1.04) and of which two corners at the side of +Y were beveled, as illustrated in FIG. 17.

The reason why the two corners were beveled is that the oxidation rates for near the −y direction and near the −x direction were approximately 1.1 times the oxidation rates for the +X direction, −Y direction and −X direction.

The shape of the electric current passage area 408b is mirror-image-symmetric with respect to (0 1 −1) plane passing through the center of the electric current passage area 408b.

Light with polarization directions that were the Y-axis directions was stably emitted from the surface-emitting laser element 100C. Furthermore, output light from the surface-emitting laser element 100C was provided such that its FFP was axially symmetric with respect to the Z-axis directions and its divergence angle was 7.0°, while the cross-sectional shape of a light beam was circular.

Additionally, when each of the lengths of the mesa in the X-axis directions and Y-axis directions was 28.0 μm for comparison, the shape of an electric current passage area was a shape such that two corners of a rectangle in which its length in the X-axis directions was 4.0 μm and its length in the Y-axis directions was 5.0 μm (largest width/smallest width=1.25) were beveled. Then, output light was provided such that its divergence angle in the X-axis directions was 7.00 and its divergence angle in the Y-axis directions was 4.9°, while the cross-sectional shape of a light beam was elliptical.

Figure 18:
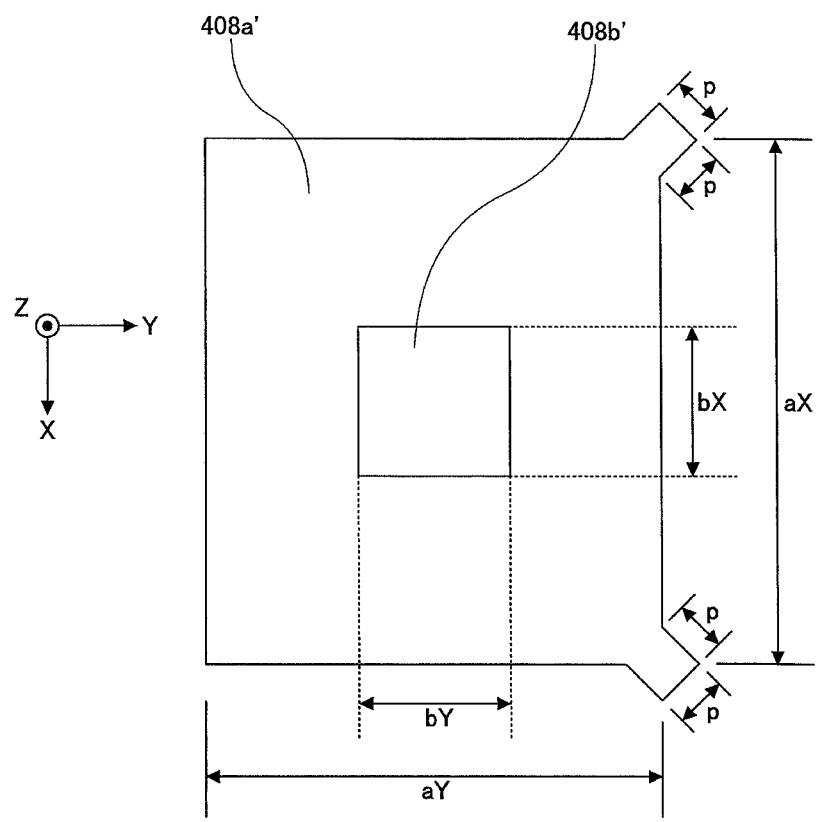
FIG. 18 is a diagram for illustrating an oxidized and narrowed structure (example 2) of variation example 3 of a surface-emitting laser element.

In this case, protruding parts with a side length of 6 μm (symbol "p" in FIG. 18) may be provided on the two corners of a square-pillar-shaped mesa at the side of +Y, as illustrated in FIG. 18 by way of example. Then, an electric current passage area 408b' with a shape of nearly square in which its length bX in the X-axis directions was 4.00 μm and its length bY in the Y-axis directions was 4.15 μm (largest width/smallest width=1.04) was formed as illustrated in FIG. 18. Additionally, reference numeral 408a' in FIG. 18 denotes an oxidation layer.

The reason why the two corners of the electric current passage area 408b' at the side of +Y are not beveled is that the shape of the mesa is adjusted such that an oxidation range in directions of a larger oxidation rate is larger. The shape of the electric current passage area 408b' is mirror-image-symmetric with respect to (0 1 −1) plane passing through the center of the electric current passage area 408b'. Additionally, the shape of a mesa may be adjusted such that an oxidation range in directions of a smaller oxidation rate is smaller.

[Surface-Emitting Laser Element 100D]

Figure 19:
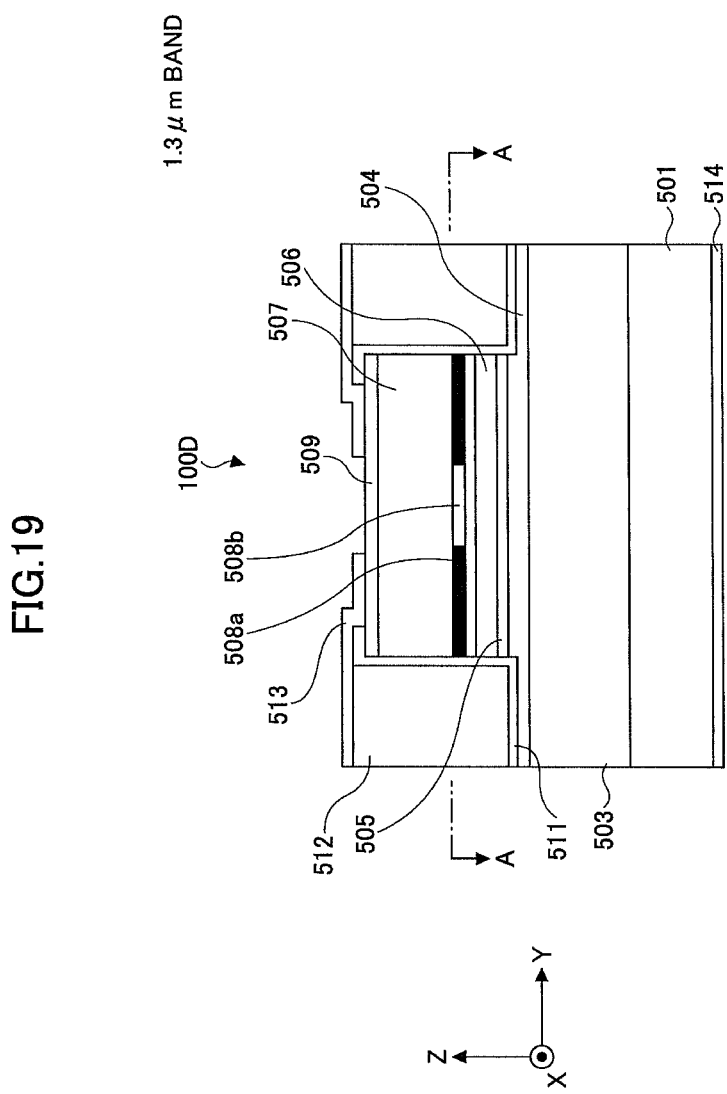
FIG. 19 is a diagram for illustrating variation example 4 of a surface-emitting laser element.

FIG. 19 illustrates a surface-emitting laser 100D whose design oscillation wavelength is a 1.3 μm band.

The surface-emitting laser element 100D includes a substrate 501, a lower semiconductor DBR 503, a lower spacer layer 504, an active layer 505, an upper spacer layer 506, an upper semiconductor DBR 507, a contact layer 509, and the like.

Figure 20A:
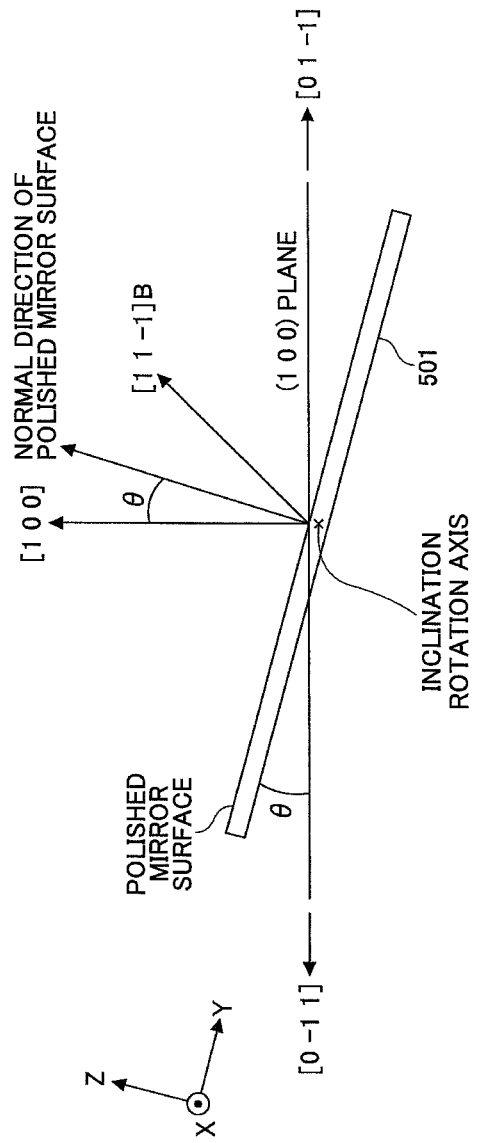
FIG. 20A and FIG. 20B are diagrams for illustrating a substrate in FIG. 19, respectively.
Figure 20B:
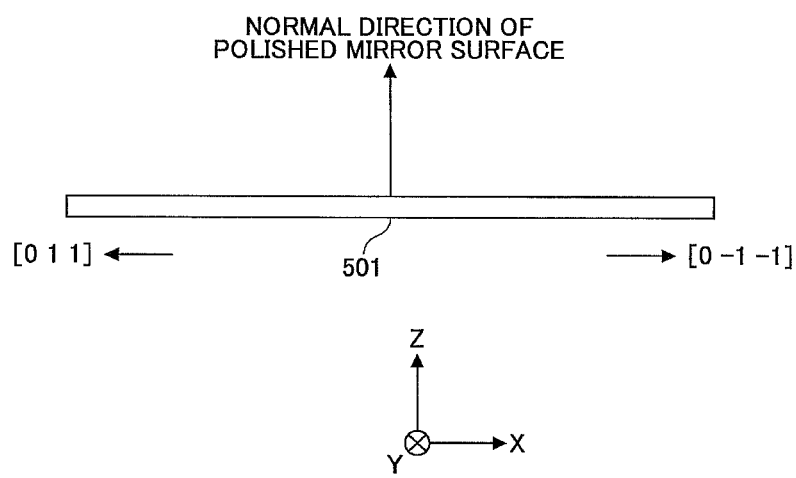

The substrate 501 has a surface that is a polished mirror surface and is a substrate of n-GaAs single crystal wherein the normal direction of the polished mirror surface inclines toward the direction of a crystallographic orientation of [1 1 −1] B by 10 degrees (θ=10 degrees) with respect to a crystallographic orientation of [1 0 0], as illustrated in FIG. 20A. That is, the substrate 501 is a so-called inclined substrate. Herein, arrangement is provided such that the direction of a crystallographic orientation of [0 −1 −1] is the +X direction and the direction of a crystallographic orientation of [0 1 1] is the −X direction, as illustrated in FIG. 20B.

The lower semiconductor DBR 503 is laminated on the surface of the substrate 501 at the side of +Z by interposing a buffer layer that is not shown in the figure and includes 35.5 pairs of a lower refractive index layer made of n-$Al_{0.9}Ga_{0.1}As$ and a higher refractive index layer made of n-GaAs. A gradient composition layer is provided between the adjacent refractive index layers. Then, any refractive index layer is designed so as to have an optical thickness of λ/4 where a half of the adjacent gradient composition layer is included.

The lower spacer layer 504 is laminated on the lower semiconductor DBR 503 at the side of +Z and is a layer made of non-doped GaAs.

The active layer 505 is laminated on the lower spacer layer 504 at the side of +Z and is a TQW active layer made of GaInNAs/GaAs.

The upper spacer layer 506 is laminated on the active layer 505 at the side of +Z and is a layer made of non-doped GaAs.

The upper semiconductor DBR 507 is laminated on the upper spacer layer 506 at the side of +Z and includes 28 pairs of a lower refractive index layer made of p-$Al_{0.9}Ga_{0.1}As$ and a higher refractive index layer made of p-GaAs. A gradient composition layer is provided between the adjacent refractive index layers. Then, any refractive index layer is designed so as to have an optical thickness of λ/4 where a half of the adjacent gradient composition layer is included.

On one of the lower refractive layers in the upper semiconductor DBR 507, a layer to be oxidized selectively which is made of p-$Al_{0.99}Ga_{0.01}As$ and has a thickness of 30 nm is inserted. The position of insertion of the layer to be oxidized selectively is in the lower refractive index layer of the second pair from the upper spacer layer 506.

The contact layer 509 is laminated on the upper semiconductor DBR 507 at the side of +Z and is a layer made of p-GaAs.

Additionally, in FIG. 19, reference numeral 508a, reference numeral 511, reference numeral 512, reference numeral 513, and reference numeral 514 denote an Al oxidation layer, a protective layer, a polyimide, a p-side electrode, and an n-side electrode, respectively.

It is possible to manufacture the surface-emitting laser element 100D similarly to the above-mentioned surface-emitting laser element 100. However, oxidation conditions were provided such that the flow rate of water was 30 g/hr, the flow rate of $N_2$ carrier gas was 20 SLM, the retention temperature was 400° C., and the retention time was 49.5 minutes. Then, the dimensions of the mesa with respect to the X-axis directions and Y-axis directions were set such that the size of an electric current passage area 508b was approximately 4.5 μm in each of the X-axis directions and Y-axis directions, based on the result of a preparatory experiment similar to the above-mentioned one.

Specifically, when the oxidation rate for the +X direction is 1.00 in the oxidation rate for each crystallographic orientation on the above-mentioned oxidation conditions, the oxidation rate for the −X direction, the oxidation rate for the −Y direction, and the oxidation rate for the +Y direction are 1.00, 1.04, and 0.89, respectively, and the ratio of an average oxidation rate for the Y-axis directions to an average oxidation rate for the X-axis directions is 0.965. Herein, the length aX of the outline of a mesa in the X-axis directions (see FIG. 21) was 32.5 μm and its length aY in the Y-axis directions (see FIG. 21) was 31.5 μm. That is, aX>aY.

Figure 21:
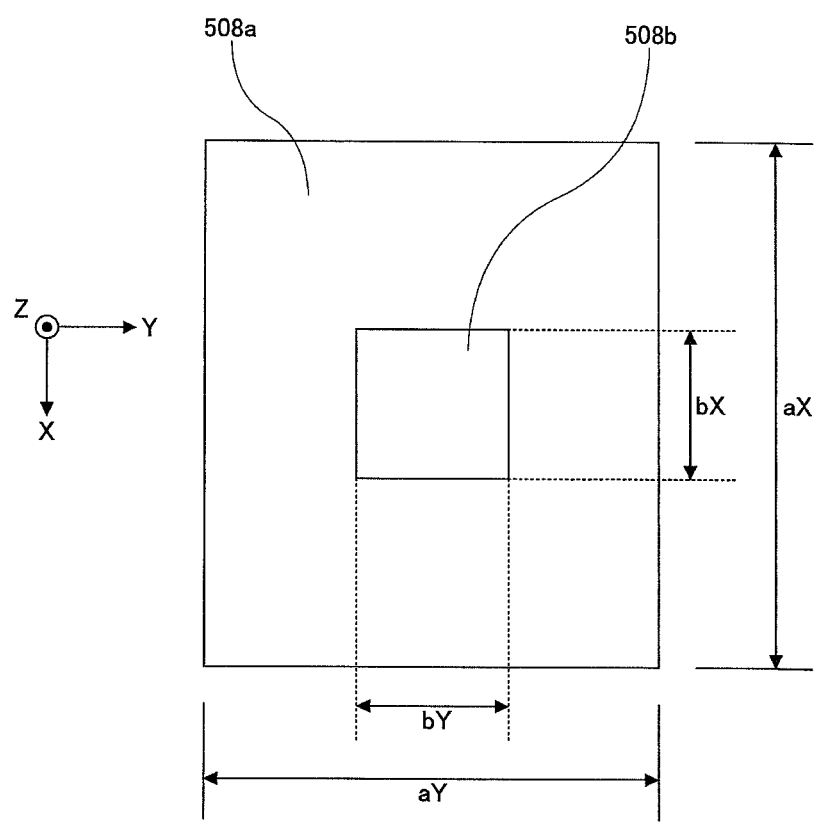
FIG. 21 is a diagram for illustrating an oxidized and narrowed structure of variation example 4 of a surface-emitting laser element.
Figure 23A:
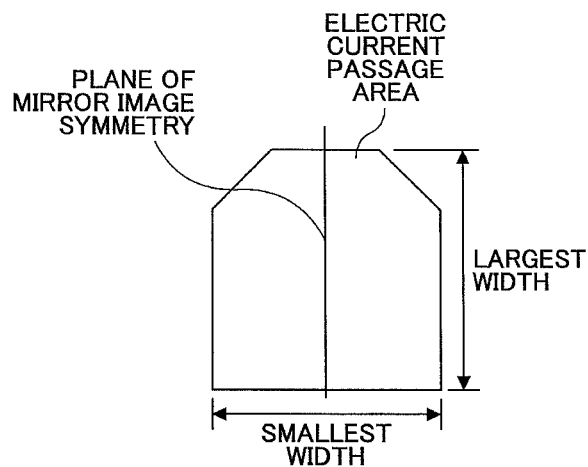
FIG. 23A-FIG. 23F are diagrams for illustrating a variation example of the shape of an electric current passage area, respectively.
Figure 23B:
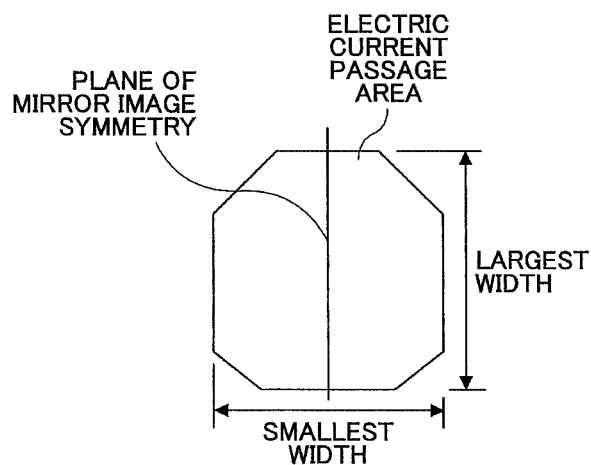
Figure 23C:
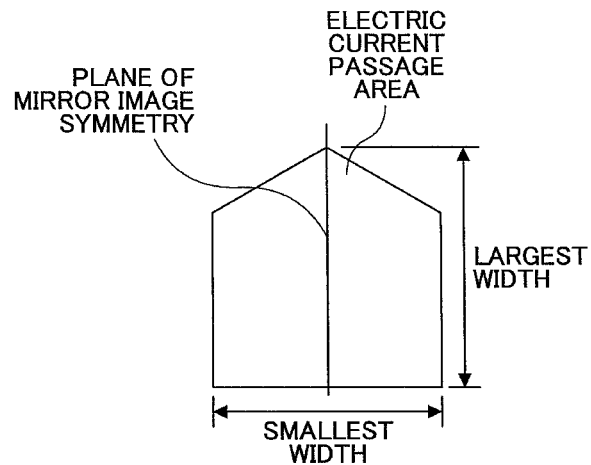
Figure 23D:
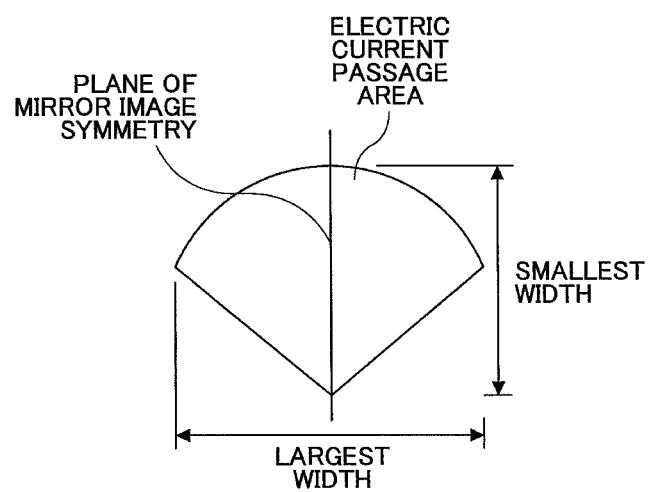
Figure 23E:
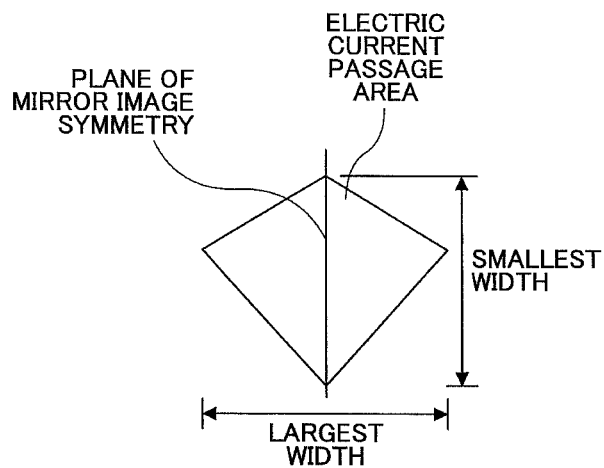
Figure 23F:
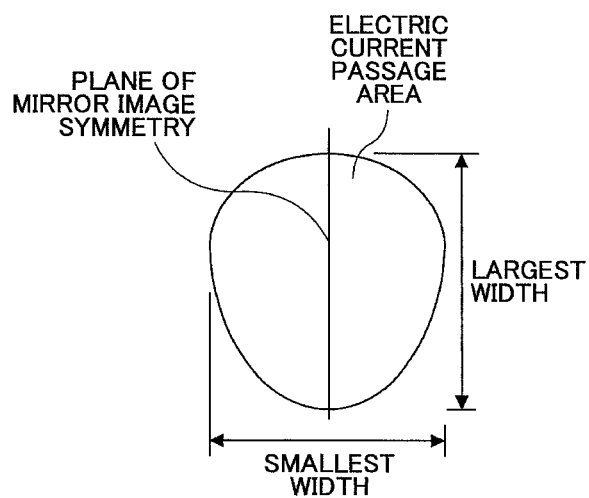

When an oxidized and narrowed structure of the surface-emitting laser element 100D was observed by an SEM, a shape of nearly square was provided in which its length bX in the X-axis directions was 4.50 μm and its length bY in the Y-axis directions was 5.17 μm (largest width/smallest width=1.15), as illustrated in FIG. 21.

Light with polarization directions that were the X-axis directions was stably emitted from the surface-emitting laser element 100D. Furthermore, output light from the surface-emitting laser element 100D was provided such that its divergence angle in the X-axis directions was 6.00 and its divergence angle in the Y-axis directions was 5.4°, while the cross-sectional shape of a light beam was nearly circular.

Additionally, when each of the lengths of the mesa in the X-axis directions and Y-axis directions was 32.5 μm for comparison, the shape of an electric current passage area was a rectangular shape in which its length in the X-axis directions was 4.5 μm and its length in the Y-axis directions was 5.5 μm (largest width/smallest width=1.22). Then, output light was provided such that its divergence angle in the X-axis directions was 6.0° and its divergence angle in the Y-axis directions was 5.0°, while the cross-sectional shape of a light beam was elliptical.

FIG. 22 illustrates the relations among the ratio of the largest width/the smallest width in the shape of an electric current passage area, a divergence angle, and the cross-sectional shape of a light beam. Thereby, it is found that the ratio of the largest width to the smallest width in the shape of an electric current passage area is preferably less than 1.2 in order to stabilize light polarization directions independently of an oscillation wavelength and to make the cross-sectional shape of a light beam be nearly circular.

Furthermore, the shape of an electric current passage area may be a shape having a mirror image symmetry as illustrated in FIG. 23A-FIG. 23F. In regard to such a shape, it may also be possible to stabilize a light polarization direction independently of an oscillation wavelength when the ratio of the largest width to the smallest width is less than 1.2.

[Surface-Emitting Laser Array 500]

Figure 24:
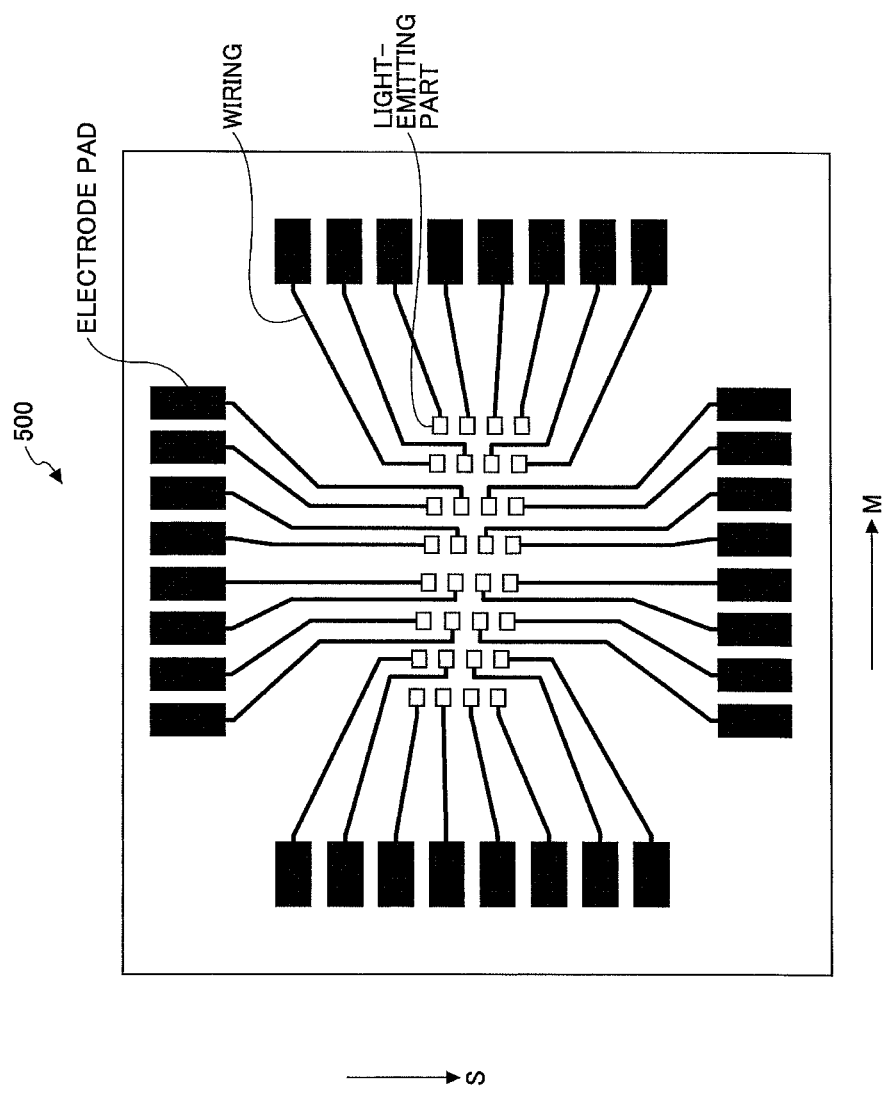
FIG. 24 is a diagram for illustrating a surface-emitting laser array.

Moreover, in the above-mentioned embodiment, the light source 14 may have a surface-emitting laser array 500 as illustrated in FIG. 24 by way of example, in place of the above-mentioned surface-emitting laser element 100.

For the surface-emitting laser array 500, plural (herein, 32) light-emitting parts are arranged on the same substrate. In FIG. 24, the direction of "M" is a main scanning corresponding direction and the direction of "S" is a sub-scanning corresponding direction. Additionally, the number of the light-emitting parts is not limited to 32.

Figure 25:
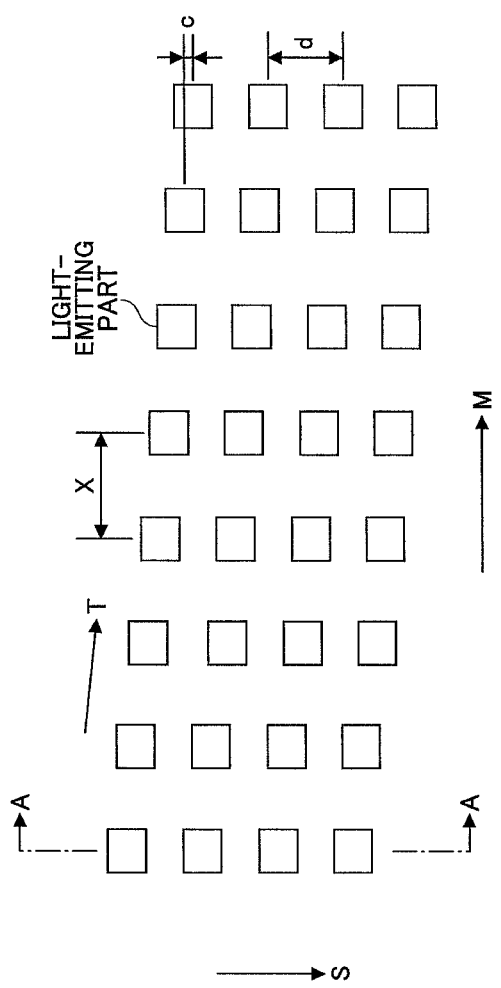
FIG. 25 is a diagram for illustrating a two-dimensional arrangement of light-emitting parts in FIG. 24.

As illustrated in FIG. 25, the surface-emitting laser array 500 includes 4 light-emitting part sequences in which 8 light-emitting parts are arranged at equal spaces along the direction of "T" which is a direction inclining from the direction of "M" to the direction of "S". Then, these 4 light-emitting part sequences are arranged at equal spaces of "d" to the direction of "S" so that if all the light-emitting parts were orthographically projected onto a virtual line extending in the directions of "S" they would be at equal spaces of "c". That is, the 32 light-emitting parts are arrayed two-dimensionally. Additionally, a "light-emitting part space" in the present specification refers to a distance between the centers of two light-emitting parts.

Herein, the space of "c" is 3 μm and the space of "d" is 24 μm while the light-emitting part space in the directions of "M" (see FIG. 25) is 30 μm.

Figure 26:
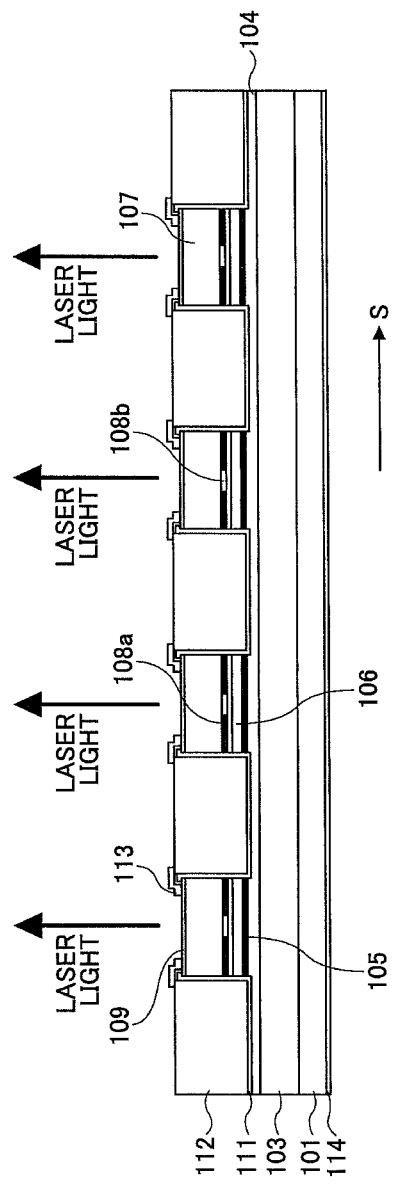
FIG. 26 is an A-A cross-section diagram of FIG. 25.

As illustrated in FIG. 26 that is an A-A cross-sectional diagram of FIG. 25, each light-emitting part has a structure similar to that of the above-mentioned surface-emitting laser element 100. Then, it is possible to manufacture the surface-emitting laser array 500 by a method similar to that of the surface-emitting laser element 100.

Thus, the surface-emitting laser array 500 is a surface-emitting laser array in which the surface-emitting laser elements 100 are integrated, and therefore, it is possible to obtain an effect similar to that of the surface-emitting laser element 100.

In this case, if each light-emitting part in the surface-emitting laser array 500 was orthographically projected onto a virtual line extending in the sub-scanning corresponding directions, the space between the light-emitting parts would be an equal space of "c", and therefore, when timing of their lighting is adjusted, it may be possible to consider that its configuration is similar to the case where light-emitting parts would be arranged at equal spaces on the photoconductor drum 1030 in the sub-scanning corresponding directions.

Then, because the space of "c" is 3 μm, it is possible to attain writing with a high density of 4800 dpi (dot/inch) if the magnification of an optical system of the optical scanning device 1010 is approximately 1.8. Of course, it is also possible to attain a higher density by increasing the number of light-emitting parts in the main scanning corresponding directions, providing an array arrangement such that the space of "d" is smaller and the space of "c" is even smaller, reducing the magnification of the optical system, or the like, and accordingly, it is possible to conduct a higher-quality printing. Additionally, it is possible to control writing spaces readily in the main scanning directions by means of timing of lighting of the light-emitting parts.

Furthermore, in this case, it is possible to conduct printing in the laser printer 1000 without reducing a printing speed even though its writing dot density is increased. Moreover, it is possible to increase the printing speed further in the case of the same writing dot density.

Figure 27:
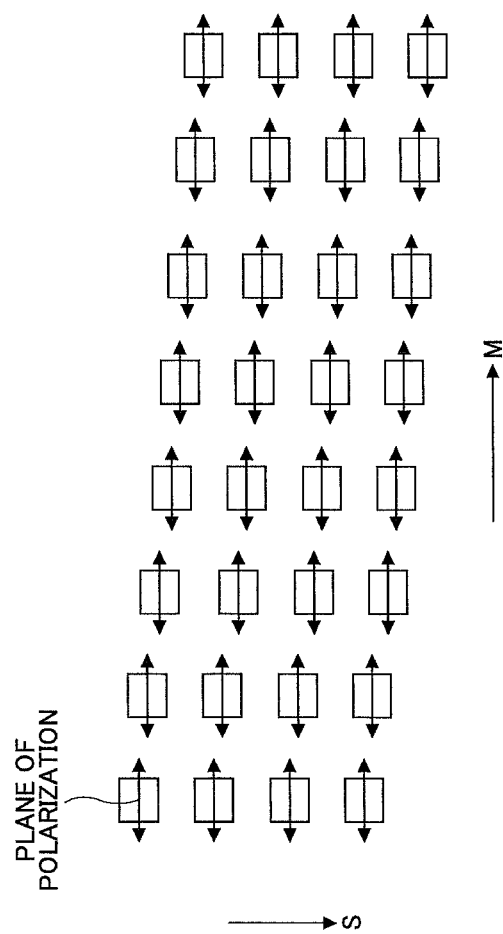
FIG. 27 is a diagram for illustrating the light polarization direction of each light-emitting par in FIG. 24.

Furthermore, in this case, the polarization directions of light beams from respective light-emitting parts are stably uniform as illustrated in FIG. 27 by way of example, and therefore, it is possible to form a high-quality image stably in the laser printer 1000.

Meanwhile, the gap between two light-emitting parts is preferably 5 µm or more for electrical and spatial separation of respective light-emitting parts. It is because it may be difficult to control etching in their manufacturing if it is too small. Furthermore, the size (side length) of a mesa is preferably 10 µm or more. It is because heat may be stored so as to degrade its characteristic if it is too small.

Moreover, a surface-emitting laser array in which light-emitting parts similar to the above-mentioned surface-emitting laser element 100 are arranged one-dimensionally may be used in place of the above-mentioned surface-emitting laser element 100 in the above-mentioned embodiment.

Furthermore, although the case of the laser printer 1000 as an image forming apparatus has been described in the above-mentioned embodiment, the present invention is not limited to it. In short, an image forming apparatus with the optical scanning device 1010 is allowed.

For example, an image forming apparatus is also allowed in which a medium (for example, a paper sheet) to be color-developed by laser light is directly irradiated with laser light.

Also, an image forming apparatus using a silver film as an image carrier is allowed. In this case, a latent image is formed on the silver film by means of optical scanning and it is possible to visualize this latent image by treatment equivalent to development treatment in a normal silver-photographic process. Then, it is possible to conduct transfer to a photographic paper by treatment equivalent to printing treatment in a normal silver-photographic process. It is possible to implement such an image forming apparatus as a photoengraving apparatus or an optical drawing apparatus for drawing an image such as a CT-scanning image.

Figure 28:
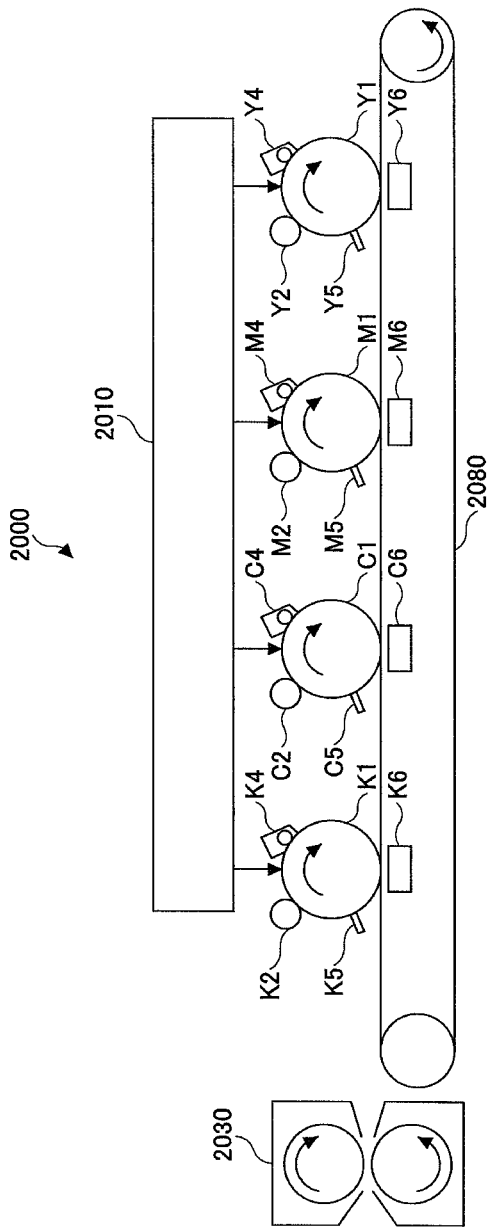
FIG. 28 is a diagram for illustrating a general structure of a color printer.

Furthermore, a color printer 2000 including plural photoconductor drums as illustrated in FIG. 28 by way of example is also allowed.

The color printer 2000 is a tandem-type multicolor color printer capable of overlapping four colors (black, cyan, magenta, and yellow) so as to form a full-color image and includes a "photoconductor drum K1, charging device K2, development device K4, cleaning unit K5, and transfer device K6" for black, a "photoconductor drum C1, charging device C2, development device C4, cleaning unit C5, and transfer device C6" for cyan, a "photoconductor drum M1, charging device M2, development device M4, cleaning unit M5, and transfer device M6" for magenta, a "photoconductor drum Y1, charging device Y2, development device Y4, cleaning unit Y5, and transfer device Y6" for yellow, an optical scanning device 2010, a transfer belt 2080, a fixation unit 2030, and the like.

Each photoconductor drum rotates to the direction of an arrow in FIG. 28 and each of the charging device, development device, transfer device, and cleaning unit is arranged around each photoconductor drum along the direction of rotation. Each charging device charges the surface of a corresponding photoconductor drum uniformly. The surface of each photoconductor drum which has been charged by the charging device is irradiated with light by the optical scanning device 2010 such that a latent image is formed on each photoconductor drum. Then, a toner image is formed on the surface of each photoconductor drum by a corresponding development device. Furthermore, a toner image of each color is transferred to a recording paper sheet on the transfer belt 2080 by a corresponding transfer device, and finally, the image is fixed on the recording paper sheet by the fixation unit 2030.

The optical scanning device 2010 includes a light source similar to the above-mentioned light source 14 for each color. Thereby, it is possible to obtain an effect similar to that of the above-mentioned optical scanning device 1010. Furthermore, the color printer 2000 includes the optical scanning device 2010, and therefore, it is possible to obtain an effect similar to that of the above-mentioned laser printer 1000.

Meanwhile, the color printer 2000 may cause a color shift due to a manufacturing error or positional error of each component or the like. Even in such a case, it may be possible to reduce the color shift by changing a light-emitting part to be lightened if each light source of the optical scanning device 2010 includes a surface-emitting laser array similar to the above-mentioned surface-emitting laser array 500.

Figure 29:
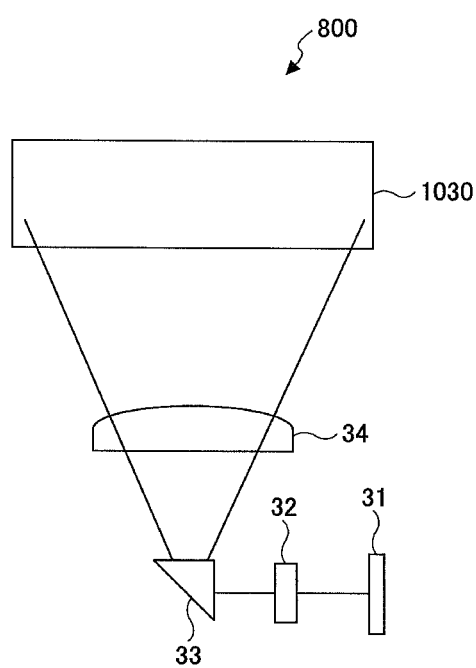
FIG. 29 is a diagram for illustrating a general structure of an image forming apparatus having an optical system using no mechanical rotation mechanism.

Furthermore, a surface-emitting laser element similar to the above-mentioned surface-emitting laser element 100 or a surface-emitting laser array similar to the above-mentioned surface-emitting laser array 500 may be used as a light source for an image forming apparatus including an optical system that does not use a mechanical rotation mechanism such as a polygon mirror (for example, see Japanese Patent No. 3713725 and Japanese Patent No. 3677883). An image forming apparatus as illustrated in FIG. 29 by way of example includes a light source unit 31 including the surface-emitting laser array 500, a collimator lens 32, a fixed mirror 33, an fθ lens 34, a photoconductor drum 1030, and the like. Even in this case, it is possible to form a high-quality image, similarly to the above-mentioned laser printer 1000.

As described above, a surface-emitting laser element or surface-emitting laser array according to an embodiment of the present invention may be suitable for increasing the stability of a light polarization direction and making the cross-sectional shape of an output light beam to be nearly circular while no cost increase is caused. Furthermore, an optical scanning device according to an embodiment of the present invention may be suitable for conducting optical scanning with a high precision while no cost increase is caused. Moreover, an image forming apparatus according to an embodiment of the present invention may be suitable for forming a high-quality image while no cost increase is caused.

Although the illustrative embodiments and specific examples of the present invention have been described with reference to the accompanying drawings, the present invention is not limited to any of the illustrative embodiments and specific examples and the illustrative embodiments and specific examples may be altered, modified, or combined without departing from the scope of the present invention.

The present application claims the benefit of its priority based on Japanese Patent Application No. 2008-148008 filed on Jun. 5, 2008 in Japan, the entire contents of which are hereby incorporated by reference herein.

What is claimed is:

1. A surface-emitting laser element configured to emit light in a direction perpendicular to a substrate, comprising:
   the substrate provided with a normal direction of a principal plane inclining toward one direction of a crystallographic orientation of <1 1 1> with respect to one direction of a crystallographic orientation of <1 0 0>; and
   a mesa structure formed on the substrate and having a narrowed structure with an oxide surrounding an electric current passage area, said oxide including at least an oxide produced by oxidizing a part of a layer to be oxidized selectively, said layer containing aluminum,
   wherein:
   a shape of a cross-section of the electric current passage area parallel to the substrate is a square shape;

one of two sides of the square shape orthogonal to each other is parallel to a first direction which is parallel to a surface of the substrate and orthogonal to both of said one direction of the crystallographic orientation of <1 0 0> and said one direction of the crystallographic orientation of <1 1 1>;

another of the two sides of the square shape orthogonal to each other is parallel to a second direction which is parallel to a surface of the substrate and orthogonal to the first direction;

a shape of a cross-section of the mesa structure parallel to the substrate is a rectangular shape;

a longer side of two sides of the rectangular shape orthogonal to each other is parallel to the first direction; and a shorter side of the two sides of the rectangular shape orthogonal to each other is parallel to the second direction, and wherein a length obtained by subtracting a length of the electric current passage area in the second direction from a length of the mesa structure in the second direction is 0.937 to 0.995 times as large as a length obtained by subtracting a length of the electric current passage area in the first direction from a length of the mesa structure in the first direction.

2. The surface-emitting laser element as claimed in claim 1, wherein the length obtained by subtracting the length of the electric current passage area in the second direction from the length of the mesa structure in the second direction is 0.937 to 0.964 times as large as the length obtained by subtracting the length of the electric current passage area in the first direction from the length of the mesa structure in the first direction.

3. A surface-emitting laser array, wherein the surface-emitting laser elements as claimed in claim 1 are integrated.

4. An optical scanning device configured to scan a surface to be scanned with a light beam, comprising:
   a light source having the surface-emitting laser array as claimed in claim 3;
   a deflector configured to deflect a light beam from the light source; and
   a scanning optical system configured to focus a light beam deflected by the deflector on a surface to be scanned.

5. An image forming apparatus configured to form an image on an object using plural light beams, wherein the plural light beams are plural light beams emitted from the surface-emitting laser array as claimed in claim 3.

6. An optical scanning device configured to scan a surface to be scanned with a light beam, comprising:
   a light source having the surface-emitting laser element as claimed in claim 1;
   a deflector configured to deflect a light beam from the light source; and
   a scanning optical system configured to focus a light beam deflected by the deflector on a surface to be scanned.

7. An image forming apparatus comprising:
   at least one image carrier; and
   at least one optical scanning device as claimed in claim 6 configured to scan said at least one image carrier with a light beam containing image information.

8. The image forming apparatus as claimed in claim 7, wherein the image information is multi-color image information.

9. An image forming apparatus configured to form an image on an object using a light beam, wherein the light beam is a light beam emitted from the surface-emitting laser element as claimed in claim 1.

* * * * *